(12) United States Patent
Jeong et al.

(10) Patent No.: US 8,513,679 B2
(45) Date of Patent: Aug. 20, 2013

(54) SEMICONDUCTOR LIGHT-EMITTING DEVICE AND METHOD FOR FABRICATING THE SAME

(75) Inventors: Hwan Hee Jeong, Ulsan (KR); Sang Youl Lee, Jeonju-si (KR); June O Song, Yongin-si (KR); Ji Hyung Moon, Gwangju (KR); Kwang Ki Choi, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 234 days.

(21) Appl. No.: 12/797,927

(22) Filed: Jun. 10, 2010

(65) Prior Publication Data

US 2011/0089452 A1 Apr. 21, 2011

(30) Foreign Application Priority Data

Oct. 15, 2009 (KR) .................. 10-2009-0098363

(51) Int. Cl.
*H01L 27/15* (2006.01)

(52) U.S. Cl.
USPC  257/79; 257/91; 257/E33.067; 257/E33.066; 257/E33.068

(58) Field of Classification Search
None
See application file for complete search history.

(56) References Cited

U.S. PATENT DOCUMENTS

| 6,744,071 B2 | 6/2004 | Sano et al. | |
|---|---|---|---|
| 6,946,683 B2 | 9/2005 | Sano et al. | |
| 7,372,078 B2 | 5/2008 | Jang et al. | |
| 7,755,095 B2 | 7/2010 | Nagai | |
| 7,829,911 B2 | 11/2010 | Unno | |
| 8,004,006 B2 | 8/2011 | Nakahara et al. | |
| 8,097,478 B2 | 1/2012 | Hodota | |
| 8,274,094 B2 | 9/2012 | Lee | |
| 2003/0209720 A1 | 11/2003 | Okazaki et al. | 257/98 |
| 2005/0199885 A1* | 9/2005 | Hata et al. | 257/79 |
| 2005/0211993 A1* | 9/2005 | Sano et al. | 257/79 |
| 2006/0081869 A1 | 4/2006 | Lu et al. | 257/99 |
| 2006/0163599 A1* | 7/2006 | Tsai et al. | 257/99 |
| 2007/0096116 A1* | 5/2007 | Yasuda et al. | 257/79 |
| 2007/0108457 A1 | 5/2007 | Lai et al. | |
| 2007/0114545 A1 | 5/2007 | Jang et al. | |
| 2007/0290215 A1* | 12/2007 | Kato et al. | 257/79 |
| 2008/0006836 A1* | 1/2008 | Lee | 257/98 |

(Continued)

FOREIGN PATENT DOCUMENTS

| CN | 101183699 | 5/2008 |
|---|---|---|
| EP | 2063468 | 5/2009 |

(Continued)

OTHER PUBLICATIONS

European Search Report dated Nov. 25, 2010 issued in Application No. 10 16 6248.

(Continued)

*Primary Examiner* — Fei Fei Yeung Lopez
(74) *Attorney, Agent, or Firm* — KED & Associates LLP

(57) ABSTRACT

A semiconductor light-emitting device is provided. The semiconductor light-emitting device may include a light-emitting structure, an electrode, a reflective layer, a conductive support member, and a channel layer. The light-emitting structure may include a plurality of compound semiconductor layers. The electrode may be disposed on the compound semiconductor layer. The reflective layer may be disposed under the compound semiconductor layer. The conductive support member may be disposed under the reflective layer. The channel layer may be disposed along a bottom edge of the compound semiconductor layer.

18 Claims, 44 Drawing Sheets

(56) References Cited

U.S. PATENT DOCUMENTS

| | | | |
|---|---|---|---|
| 2008/0135859 A1 | 6/2008 | Cho et al. | |
| 2008/0145962 A1 | 6/2008 | Song et al. | |
| 2008/0258174 A1 | 10/2008 | Seong | |
| 2009/0141502 A1* | 6/2009 | Sonoda et al. | 362/311.02 |
| 2009/0173952 A1 | 7/2009 | Takeuchi et al. | |
| 2010/0012969 A1 | 1/2010 | Yoon et al. | 257/99 |
| 2010/0133505 A1* | 6/2010 | Takao et al. | 257/13 |
| 2010/0230705 A1* | 9/2010 | Jeong | 257/98 |
| 2010/0264440 A1 | 10/2010 | Park | 257/98 |

FOREIGN PATENT DOCUMENTS

| | | |
|---|---|---|
| EP | 2 216 833 | 8/2010 |
| EP | 2 228 838 | 9/2010 |
| EP | 2 312 655 | 4/2011 |
| JP | 6-13343 | 1/1994 |
| JP | 9-167856 | 6/1997 |
| JP | 2000-174345 | 6/2000 |
| JP | 2004-193338 | 7/2004 |
| JP | 2006-173386 | 6/2006 |
| JP | 2006-216816 | 8/2006 |
| JP | 2007-134415 | 5/2007 |
| JP | 2007-142368 | 6/2007 |
| JP | 2007-150310 | 6/2007 |
| JP | 2007-517378 | 6/2007 |
| JP | 2007-258326 | 10/2007 |
| JP | 2008-518436 | 5/2008 |
| JP | 2008-277342 | 11/2008 |
| JP | 2008-294482 | 12/2008 |
| JP | 2009-212357 | 9/2009 |
| KR | 10-2004-0010419 | 1/2004 |
| KR | 10-2006-0035424 | 4/2006 |
| KR | 10-2006-0035424 A | 4/2006 |
| KR | 10-2006-0054089 | 5/2006 |
| KR | 10-2008-0030106 | 4/2008 |
| KR | 10-2008-0048707 | 6/2008 |
| KR | 10-2008-0061693 | 7/2008 |
| KR | 10-2008-0061697 | 7/2008 |
| KR | 10-2009-0015633 | 2/2009 |
| KR | 10-2009-0054008 | 5/2009 |
| KR | 10-2009-0054008 A | 5/2009 |
| KR | 10-2009-0104931 | 10/2009 |
| WO | WO 03/065464 | 8/2003 |
| WO | WO 2006/043796 | 4/2006 |
| WO | WO 2008/152988 | * 12/2008 |
| WO | WO 2009/002040 A2 | 12/2008 |
| WO | WO 2009/004980 | 1/2009 |
| WO | WO 2009/045082 | 4/2009 |
| WO | WO 2009/117845 A1 | 10/2009 |

OTHER PUBLICATIONS

Korean Office Action dated Jan. 7, 2011 issued in Application No. 10-2009-0098355.
U.S. Office Action issued in U.S. Appl. No. 12/793,770 dated Jul. 6, 2011.
U.S. Office Action issued in U.S. Appl. No. 12/796,044 dated Jul. 22, 2011.
U.S. Office Action issued in U.S. Appl. No. 12/793,770 dated Nov. 17, 2011.
U.S. Office Action issued in U.S. Appl. No. 12/796,044 dated Jan. 11, 2012.
European Search Report dated Sep. 20, 2010 (Application No. 10165714.6-1226).
Chinese Office Action dated Aug. 10, 2012.
European Search Report dated Nov. 23, 2012.
Japanese Office Action dated Feb. 26, 2013.
Japanese Office Action dated Apr. 23, 2013. (2010-149741).
Japanese Office Action dated Apr. 23, 2013. (2010-149767).

* cited by examiner

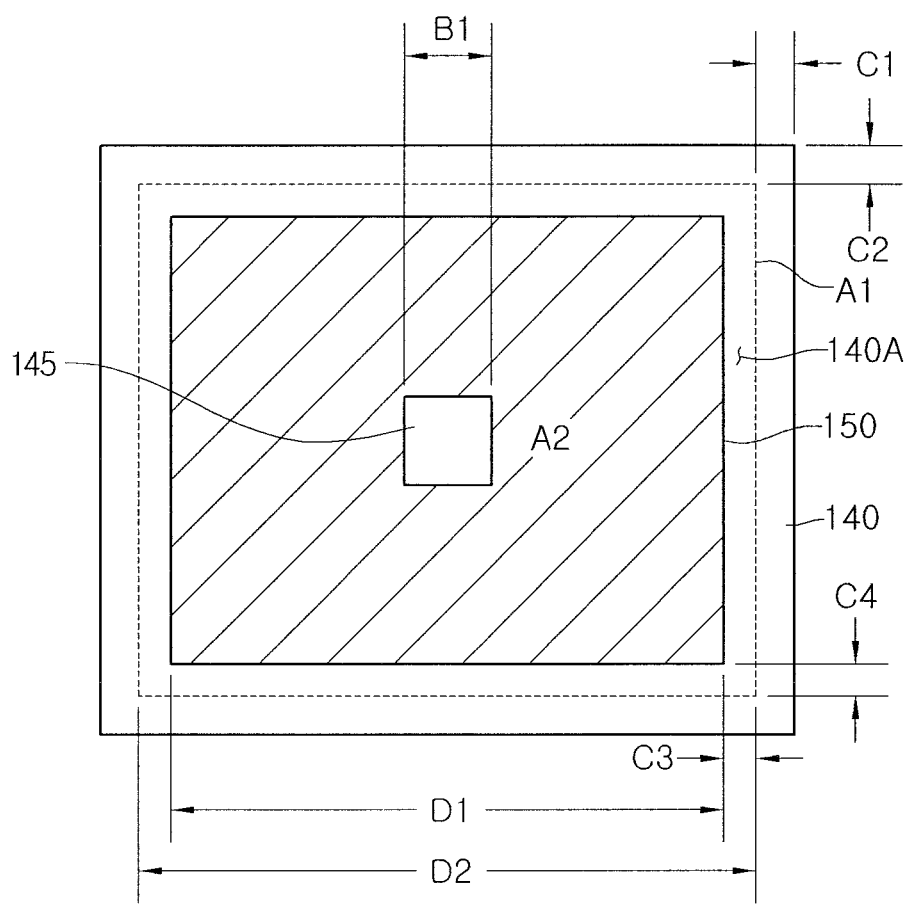

SEMICONDUCTOR LIGHT-EMITTING DEVICE AND METHOD FOR FABRICATING THE SAME

The present application claims the benefit under 35 U.S.C. §119 of Korean Patent Application No. 10-2009-0098363, filed in Korea on Oct. 15, 2009, which is hereby incorporated by reference in its entirety.

BACKGROUND

1. Field

A semiconductor light-emitting device and a method for fabricating the same are disclosed herein.

2. Background

Semiconductor light-emitting devices and methods for fabricating the same are known. However, they suffer from various disadvantages.

BRIEF DESCRIPTION OF THE DRAWINGS

Embodiments will be described in detail with reference to the following drawings in which like reference numerals refer to like elements, and wherein:

FIG. 2 is a sectional view of the semiconductor light-emitting device taken along a line II-II of FIG. 1;

DETAILED DESCRIPTION

Figure 1:
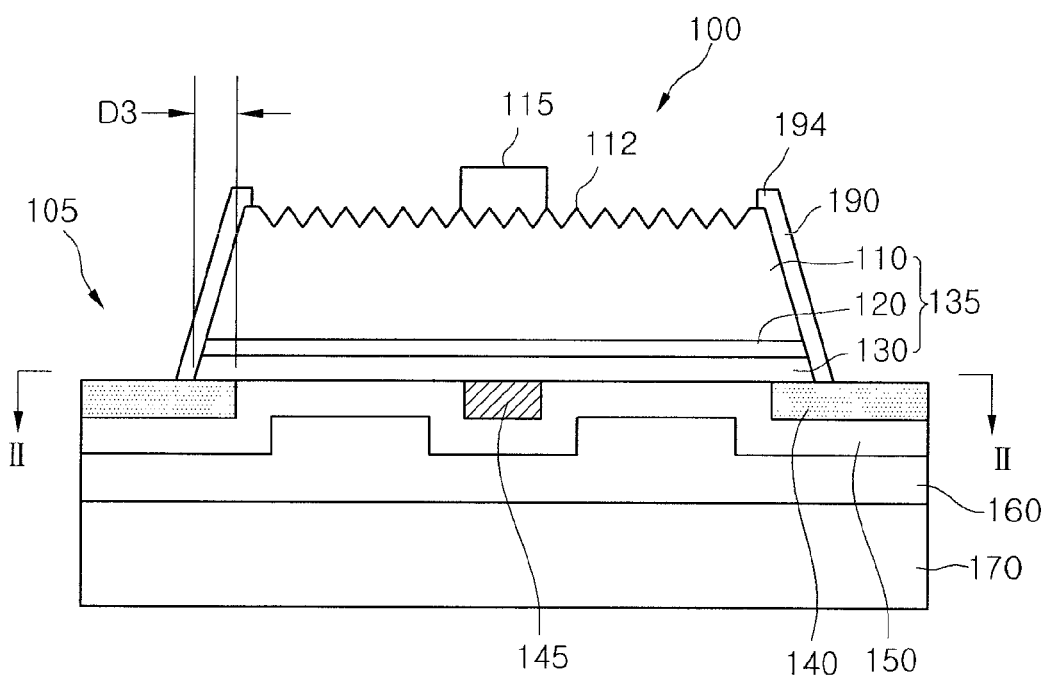
FIG. 1 is a sectional view of a semiconductor light-emitting device according to an embodiment.

Reference will now be made in detail to embodiments, examples of which are illustrated in the accompanying drawings. In the descriptions of embodiments, it should be understood that when a layer (or film), a region, a pattern, or a structure is referred to as being "on/under" a substrate, a layer (or film), a region, a pad, or patterns, it may be directly on the substrate, the layer (or film), the region, the pad, or the patterns, or intervening layers may also be present. Further, the reference about 'on' and 'under' each layer will be made on the basis of the drawings. In the drawings, dimensions of each of element may be exaggerated for clarity of illustration, and the dimensions of each of the elements may be different from the actual dimension of each of the elements.

Hereinafter, embodiments will be described with reference to the accompanying drawings. Where possible, like reference numerals have been used to indicate like elements.

Due to their physical and chemical characteristics, Group III-V nitride semiconductors are being utilized as core materials for light-emitting devices, such as light-emitting diodes (LEDs) and laser diodes (LDs). An example of the Group III-V nitride semiconductors is a nitride semiconductor with a composition equation of $In_xAl_yGa_{1-x-y}N$ ($0 \leq x \leq 1$, $0 \leq y \leq 1$, $0 \leq x+y \leq 1$).

An LED is a kind of semiconductor device that is used as a light source or uses the characteristics of compound semiconductors to converts electricity into light to exchange signals. Nit ride semiconductor based LEDs or LDs are widely used in light-emitting devices, and are applied as light sources for various products, such as keypad light-emitting units of mobile phones, electric light panels, and illumination devices.

FIG. 1 is a sectional view of a semiconductor light-emitting device according to an embodiment. FIG. 2 is a sectional view of the semiconductor light-emitting device taken along line II-II of FIG. 1.

Referring to FIGS. 1 and 2, a semiconductor light-emitting device 100 according to an embodiment may include a light-emitting structure 135 with a compound semiconductor layer, a channel layer 140, a reflective layer 150, an adhesion layer 160, and a conductive support member 170. The semiconductor light-emitting device 100 may be formed using a compound semiconductor, for example, a Group III-V compound semiconductor. The semiconductor light-emitting device 100 may emit light of a visible-ray region, such as blue, green, and red light, and may emit light of an ultraviolet region. The semiconductor light-emitting device 100 may vary in shape and structure within the technical scope of embodiments.

The light-emitting structure 135 may include a first conductivity type semiconductor layer 110, an active layer 120, and a second conductivity type semiconductor layer 130. The first conductivity type semiconductor layer 110 may be formed using, for example, a Group III-V compound semiconductor doped with a first conductivity type dopant. For example, the Group III-V compound semiconductor may include at least one selected from the group consisting of GaN, AlN, AlGaN, InGaN, InN, InAlGaN, AlInN, AlGaAs, GaP, GaAs, GaAsP, and AlGaInP. For example, if the first conductivity type semiconductor layer 110 is formed of a N type semiconductor, the first conductivity type dopant may be selected from the Group V elements. The first conductivity type semiconductor layer 110 may be formed to have, for example, a single-layer or multi-layer structure; however, embodiments are not limited thereto. A top surface of the first conductivity type semiconductor layer 110 may be formed to have a light extraction structure, such as a roughness pattern 112 for light extraction efficiency. Also, a transparent electrode layer and an insulating layer may be formed for current diffusion and light extraction; however, embodiments are not limited thereto.

An electrode 115 may be disposed on the first conductivity type semiconductor layer 110. The electrode 115 may be, for example, a pad or may include a branch-type metal pattern connected to the pad; however, embodiments are not limited thereto. A top surface of the electrode 115 may be formed to have a roughness pattern; however, embodiments are not limited thereto.

The electrode 115 may ohmic-contact the top surface of the first conductivity type semiconductor layer 110. The electrode 115 may be formed, for example, in a single-layer or multi-layer structure by using one or more selected from the group consisting of Cr, Ti, Al, In, Ta, Pd, Co, Ni, Si, Ge, Ag, Cu, and Au. The electrode 115 may be formed, for example, of at least one selected from the above materials, in consideration of the ohmic contact with the first conductivity type semiconductor layer 110, adhesive force between the metal layers, reflective characteristics, and conductive characteristics.

The active layer 120 may be disposed under the first conductivity type semiconductor layer 110. The active layer 120 may be formed to have, for example, a single or multi quantum well structure. The active layer 120 may be formed, for example, of a Group III-V compound semiconductor to have a period of a well layer and a barrier layer. For example, the active layer 120 may be formed to have an InGaN well layer/a GaN barrier layer or an InGaN well layer/an ALGaN barrier layer.

A conductive clad layer may be formed on and/or under the active layer 120. For example, the conductive clad layer may be formed of an AlGaN-based semiconductor.

The second conductivity type semiconductor layer 130 may be disposed under the active layer 120. The second conductivity type semiconductor layer 130 may be formed using, for example, a Group III-V compound semiconductor doped with a second conductivity type dopant. For example, the Group III-V compound semiconductor may include at least one selected from the group consisting of GaN, AlN, AlGaN, InGaN, InN, InAlGaN, AlInN, AlGaAs, GaP, GaAs, GaAsP, and AlGaInP. For example, if the second conductivity type semiconductor layer 110 is formed of a P type semiconductor, the second conductivity type dopant may be selected from the Group III elements. The second conductivity type semiconductor layer 130 may be formed to have, for example, a single-layer or multi-layer structure; however, embodiments are not limited thereto.

Figure 1A:
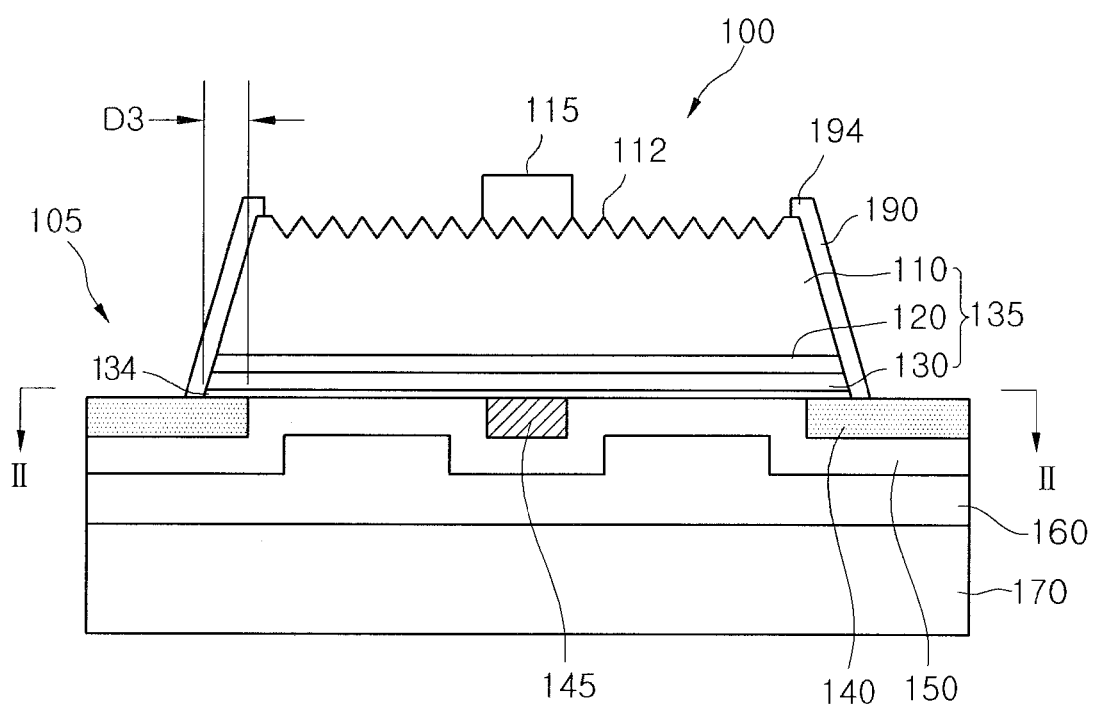
FIG. 1A is a sectional view of a semiconductor light-emitting device according to another embodiment.

The light-emitting structure 135 may further include a third conductivity type semiconductor layer 134, which may be of the first conductivity type, disposed under the second conductivity type semiconductor layer 130, as shown in FIG. 1A. The third conductivity type semiconductor layer may be opposite in polarity to the second conductivity type semiconductor layer 130. Also, the first conductivity type semiconductor layer 110 may be a P-type semiconductor layer, and the second conductivity type semiconductor layer 130 may be a N-type semiconductor layer. Accordingly, the light-emitting structure 135 may include at least one of a N-P junction structure, a P-N junction structure, a N-P-N junction structure, and a P-N-P junction structure.

The channel layer 140 and the reflective layer 150 may be disposed under the second conductivity type semiconductor layer 130 or the third conductivity type semiconductor layer 134. Hereinafter, for convenience in description, it is assumed that the second conductivity type semiconductor layer 130 is disposed as the lowermost layer of the light-emitting structure 135.

The reflective layer 150 may contact a bottom inner side of the second conductivity type semiconductor layer 130, and the channel layer 140 may contact a bottom edge of the second conductivity type semiconductor layer 130. The channel layer 140 may be disposed on a channel region 105. The channel region 105 may be an inter-chip boundary region, for example, an edge region of the semiconductor light-emitting device. A top outer side of the channel layer 140 may be exposed to the outside, or may be covered by an insulating layer 190. A top inner side of the channel layer 140 may contact a bottom outer side of the second conductivity type semiconductor layer 130.

The channel layer 140 may be formed, for example, in a loop, ring or frame pattern along a bottom edge of the second conductivity type semiconductor layer 130. The channel layer 140 may include, for example, a continuous pattern shape or a discontinuous pattern shape. Also, the channel layer 140 may be formed on a path of a laser beam irradiated onto the channel region in a fabrication process.

The channel layer 140 may be formed, for example, of at least one of oxide, nitride, or an insulating material. For example, the channel layer 140 may be formed of at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$.

The channel layer 140 may prevent the occurrence of an electrical short even when an outer wall of the light-emitting structure 135 is exposed to moisture, thus making an LED robust against high humidity. When the channel layer 140 is formed of a transparent material, irradiated laser beams may be transmitted in a laser scribing process, thereby preventing a metal material from being fragmented in the channel region 105 due to laser irradiation. Accordingly, an interlayer short in sidewalls of the light-emitting structure 135 may be prevented.

The channel layer 140 may provide a predetermined interval between the reflective layer 150 and the outer wall of each layer 110/120/130 of the light-emitting structure 135. The channel layer 140 may be formed to a thickness of about 0.02 μm to about 5 μm. The thickness of the channel layer 140 may vary according to chip size.

The reflective layer 150 may ohmic-contact the bottom surface of the second conductivity type semiconductor layer 130 and may include a reflective metal. The reflective layer 150 may include, for example, seed metal used for a plating process. Accordingly, the reflective layer 150 may include an ohmic layer, a seed layer, and/or a reflective layer selectively; however, embodiments are not limited thereto.

The reflective layer 150 may extend to a bottom surface of the channel layer 140, and may be formed to contact the entire bottom surface of the channel layer 140. The reflective layer 150 may be formed to have a larger width and/or length than the light-emitting structure 135, thus reflecting incident light effectively. Accordingly, light extraction efficiency may be improved.

The reflective layer 150 may be formed, for example, in a single-layer or multi-layer structure by using one selected from the group consisting of Ag, Ni, Al, Rh, Pd, Ir, Ru, Mg, Zn, Pt, Au, Hf, and a combination thereof. The reflective layer 150 may be formed in, for example, a multi-layer structure by using the above materials and conductive oxide materials such as IZO, IZTO, IAZO, IGZO, IGTO, AZO, and ATO. For example, the reflective layer 150 may be formed in a structure, such as IZO/Ni, AZO/Ag, IZO/Ag/Ni, and AZO/Ag/Ni.

A current blocking layer 145 may be formed in a partial region between the reflective layer 150 and the second conductivity type semiconductor layer 130. The current blocking layer 145 may be formed of a nonmetallic material having a lower electrical conductivity than the reflective layer 150. For example, the current blocking layer 145 may be formed of at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, and $TiO_2$. Herein, if the reflective layer 150 is formed of Ag, the current blocking layer 145 may be formed of ITO, ZnO, or $SiO_2$.

The current blocking layer 145 may be formed of the same material as or a different material from the channel layer 140. If the current blocking layer 145 and the channel layer 140 are formed of the same material, they may be formed using the same process.

The current blocking layer 145 may be formed to correspond to a position and pattern of the electrode 115. A size of the current blocking layer 145 may vary according to a degree of current diffusion.

The current blocking layer 145 may be disposed in a structure corresponding to the electrode 115, thus diffusing a current throughout an entire region of the chip. Also, the current blocking layer 145 may be formed at an interface between the reflective layer 150 and the adhesion layer 160, or at the interface between the second conductivity type semiconductor layer 130 and the adhesion layer 160; however, embodiments are not limited thereto.

The adhesion layer 160 may be formed to contact a bottom of the reflective layer 150 without contacting a bottom of the channel layer 140. The adhesion layer 160 may include, for example, a barrier metal or a bonding metal. For example, the adhesion layer 160 may be formed of at least one selected from the group consisting of Ti, Au, Sn, Ni, Cr, Ga, In, Bi, Cu, Ag, and Ta.

The conductive support member 170 may be disposed under the adhesion layer 160. The conductive support member 170 may be adhered to the reflective layer 150 by, for example, plating or sheet without forming the adhesion layer 160.

The conductive support member 170 may be a base substrate formed using, for example, copper (Cu), aurum (Au), nickel (Ni), molybdenum (Mo), copper-tungsten (Cu—W), or a carrier wafer (for example, Si, Ge, GaAs, ZnO, SiC, GaN, and SiGe). Also, the conductive support member 170 may not be formed or may be formed, for example, using a conductive sheet.

An outer side of the light-emitting structure 135 may be inclined, and the insulating layer 190 may be formed thereon. The insulating layer 190 may have a bottom portion disposed on the channel layer 140 and a top portion 194 disposed around the first conductivity type semiconductor layer 110. Accordingly, the insulating layer 190 may closely contact the channel layer 140 and may be formed around the light-emitting structure 135, thereby preventing an interlayer short on the outer surface of the light-emitting structure 135.

Referring to FIG. 2, the channel layer 140 may be formed in a band around the chip. Inner regions C3 and C4 of the channel layer 140 may correspond to a semiconductor region A1, and outer regions C1 and C2 of the channel layer 140 may be exposed outside of the chip outside of the semiconductor region A1. An inner region 140A of the channel layer 140 may be disposed at a portion of the semiconductor region A1.

An ohmic region A2 of the reflective layer 150 may be disposed inside of the semiconductor region A1, and a width D1 of the reflective layer 150 may be smaller than a width D2 of the semiconductor region A1. The ohmic region A2 may be formed to have a size corresponding to a light-emitting region.

The current blocking layer 145 may be formed to correspond to a position and pattern of the electrode 115 in the semiconductor region A1. The current blocking layer 145 may be disposed inside of the ohmic region A2 and the semiconductor region A1. A size B1 of the current blocking layer 145 may vary according to a pad or electrode pattern.

Figure 3:
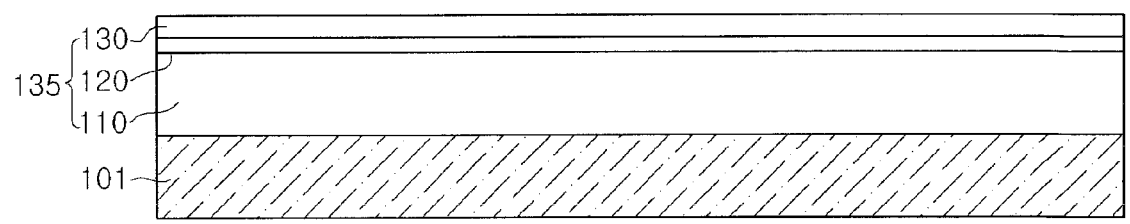
FIGS. 3 to 13 are sectional views illustrating a process for fabricating a semiconductor light-emitting device according to an embodiment.
Figure 4:
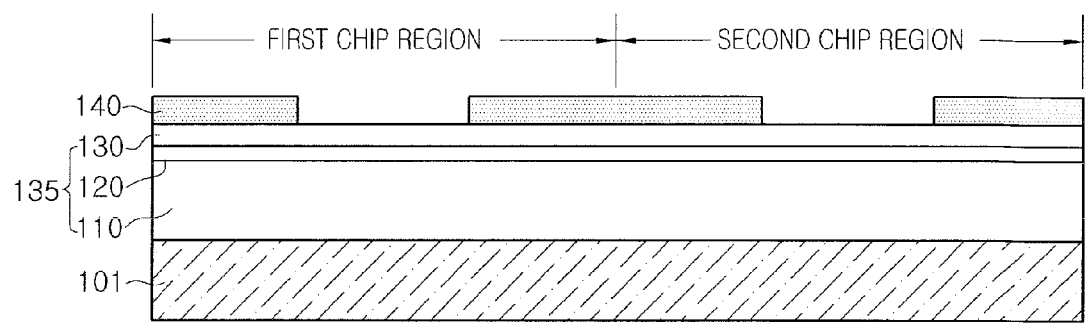

FIGS. 3 to 13 are sectional views illustrating a process for fabricating a semiconductor light-emitting device according to an embodiment. Referring to FIGS. 3 and 4, a substrate 101 may be loaded on a growth equipment, and a Group II to VI compound semiconductor may be formed thereon in, for example, a layer or pattern shape. The growth equipment may be, for example, one of a PVD (physical vapor deposition) equipment, a CVD (chemical vapor deposition) equipment, a PLD (plasma laser deposition) equipment, a dual-type thermal evaporator, a sputtering equipment, and an MOCVD (metal organic chemical vapor deposition) equipment; however, embodiments are not limited thereto.

The substrate 101 may be formed, for example, of at least one selected from the group consisting sapphire ($Al_2O_3$), GaN, SiC, ZnO, Si, GaP, InP, $Ga_2O_3$, conductive material, and GaAs. A roughness pattern may be formed in a top surface of the substrate 101. Also, a layer or pattern based on a Group II to VI compound semiconductor, for example, at least one of an ZnO layer (not illustrated), a buffer layer (not illustrated) and an undoped semiconductor layer (not illustrated) may be formed on the substrate 101. The buffer layer or the undoped semiconductor layer may be formed using, for example, a group III-V compound semiconductor. The buffer layer may reduce a lattice constant with the substrate 101, and the undoped semiconductor layer may be formed of an undoped GaN-based semiconductor.

A first conductivity type semiconductor layer 110 may be formed on the substrate 101. An active layer 120 may be formed on the first conductivity type semiconductor layer 110. A second conductivity type semiconductor layer 130 may be formed on the active layer 120.

The first conductivity type semiconductor layer 110 may be formed using, for example, a Group III-V compound semiconductor doped with a first conductivity type dopant. For example, the Group III-V compound semiconductor may include at least one selected from the group consisting of GaN, AlN, AlGaN, InGaN, InN, InAlGaN, AlInN, AlGaAs, GaP, GaAs, GaAsP, and AlGaInP. For example, if the first conductivity type semiconductor layer 110 is formed of a N type semiconductor, the first conductivity type dopant may be selected from the Group V elements. The first conductivity type semiconductor layer 110 may be formed to have, for example, a single-layer or multi-layer structure; however, embodiments are not limited thereto.

The active layer 120 may be formed on the first conductivity type semiconductor layer 110. The active layer 120 may be formed to have, for example, a single or multi quantum well structure. The active layer 120 may be formed, for example, of a Group III-V compound semiconductor to have a period of a well layer and a barrier layer, for example, a period of an InGaN well layer/a GaN barrier layer or an InGaN well layer/ an AlGaN barrier layer.

A conductive clad layer may be formed on and/or under the active layer 120. For example, the conductive clad layer may be formed of an AlGaN-based semiconductor.

The second conductivity type semiconductor layer 130 may be formed on the active layer 120. The second conductivity type semiconductor layer 130 may be formed using, for example, a Group III-V compound semiconductor doped with a second conductivity type dopant. For example, the Group compound semiconductor may include at least one selected from the group consisting of GaN, AlN, AlGaN, InGaN, InN, InAlGaN, AlInN, AlGaAs, GaP, GaAs, GaAsP, and AlGaInP. For example, if the second conductivity type semiconductor layer 110 is formed of a P type semiconductor, the second conductivity type dopant may be selected from the Group III elements. The second conductivity type semiconductor layer 130 may be formed to have, for example, a single-layer or multi-layer structure; however, embodiments are not limited thereto.

The first conductivity type semiconductor layer 110, the active layer 120, and the second conductivity type semiconductor layer 130 may constitute a light-emitting structure 135. Also, a third conductivity type semiconductor layer 134, for example, a N-type semiconductor layer may be formed on the second conductivity type semiconductor layer 130. Accordingly, the light-emitting structure 135 may be formed to include at least one of a N-P junction structure, a P-N junction structure, a N-P-N junction structure, and a P-N-P junction structure.

A channel layer 140 may be formed in each chip boundary region (channel region). The channel layer 140 may be formed around each chip region by using, for example, a mask pattern. The channel layer 140 may be formed, for example, in a loop, ring, or frame pattern. The channel layer 140 may be formed, for example, of at least one of oxide, nitride, or insulating material. For example, the channel layer 140 may be formed of at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$.

For example, the channel layer 140 may be formed using, for example, a photolithography process. The channel-layer 140 may be formed of the above material using, for example, a sputtering process or a deposition process. If the channel layer 140 is formed of a conductive oxide material, it may serve as a current diffusion or injection layer.

Figure 5:
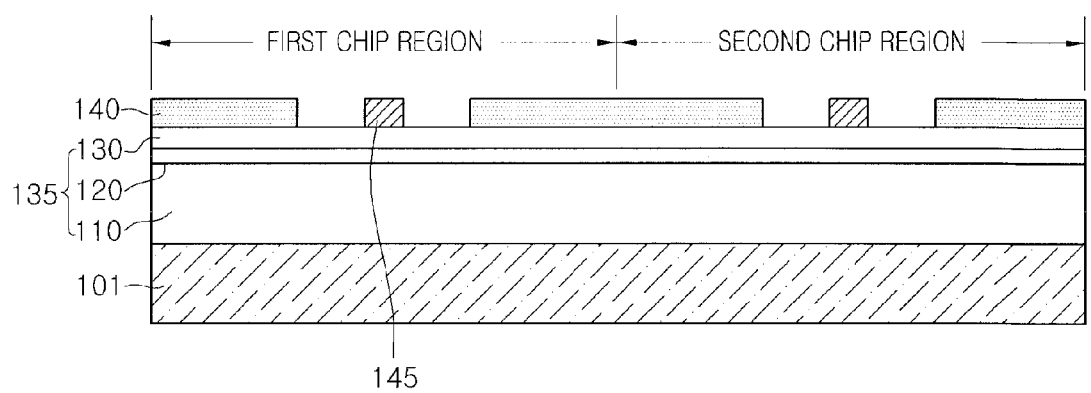
Figure 6:
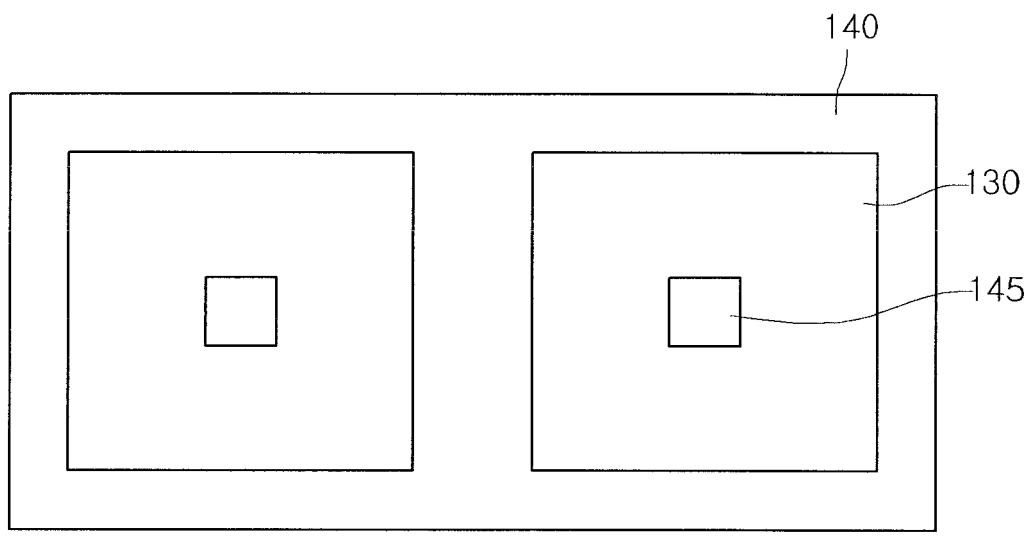

Referring to FIGS. 4 to 6, a current blocking layer 145 may be formed on the second conductivity type semiconductor layer 130. The current blocking layer 145 may be formed, for example, using a mask pattern. The current blocking layer 145 may be formed, for example, of the same material as or a different material from the channel layer 140. The formation order may vary according to such a material difference. For example, if the channel layer 140 and the current blocking layer 145 are formed of the same material, they may be formed using one process.

The current blocking layer 145 may be formed of a material having a lower electrical conductivity than the semiconductor layer, or may be formed to have a lower electrical conductivity than the semiconductor layer. For example, the current blocking layer 145 may be formed of at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, and $TiO_2$. The current blocking layer 145 may be formed in a desired region by, for example, using a mask pattern. The current blocking layer 145 may be formed to correspond to a position and pattern of a region for the electrode 115. The current blocking layer 145 may be formed in the same shape as an electrode pattern; however, embodiments are not limited thereto.

The current blocking layer 145 may be formed to correspond to a pad position and/or electrode pattern. The current blocking layer 145 may be disposed inside of the reflective layer 150. Thus, in comparison with adjacent regions, the current blocking layer 145 may have little current flowing therethrough, thus making it possible to supply a current in a diffused manner. The current blocking layer 145 may be formed, for example, in a polygonal or circular pattern, or may not be formed.

Figure 7:
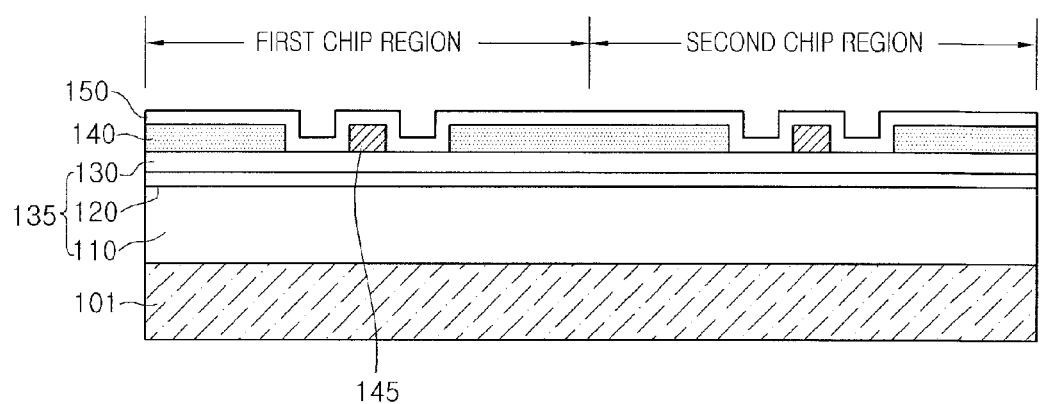

Referring to FIGS. 5 and 7, a reflective layer 150 may be formed on the second conductivity type semiconductor layer 130 to ohmic-contact the second conductivity type semiconductor layer 130. The reflective layer 150 may be formed on the second conductivity type semiconductor layer 130 and the current blocking layer 145 to reduce contact resistance.

The reflective layer 150 may be formed, for example, in a single-layer or multi-layer structure by using at least one selected from the group consisting of Ag, Ni, Al, Rh, Pd, Ir, Ru, Mg, Zn, Pt, Au, Hf, and a combination thereof. Also, the reflective layer 150 may be formed, for example, in a multi-layer structure by using the above metallic material, and a conductive oxide material, such as IZO, IZTO, IAZO, IGZO, IGTO, AZO, and ATO. For example, the reflective layer 150 may be formed of IZO/Ni, AZO/Ag, IZO/Ag/Ni, or AZO/Ag/ Ni. For example, the reflective layer 150 may be formed using, for example, an E-beam (electron beam) process or a sputtering process; however, embodiments are not limited thereto.

For example, the reflective layer 150 may be formed to have a stack structure of a first adhesion layer/a reflective layer/a second adhesion layer/a seed layer. The first and second adhesion layers may include Ni, the reflective layer may include Ag, and the seed layer may include Cu. The first adhesion layer may be formed to a thickness of less than several nm, the reflective layer may be formed to a thickness of less than hundreds of nm, and the second adhesion layer may be formed to a thickness of less than tens of nm, and the seed layer may be formed to a thickness of less than 1 µm; however, embodiments are not limited thereto.

The reflective layer 150 may be formed to cover up to a bottom of the channel layer 140. The reflective layer 150 may serve as an electrode, because it may be formed of a reflective metal. Also, the reflective layer 150 and the metal materials thereon may serve as an electrode.

Figure 8:
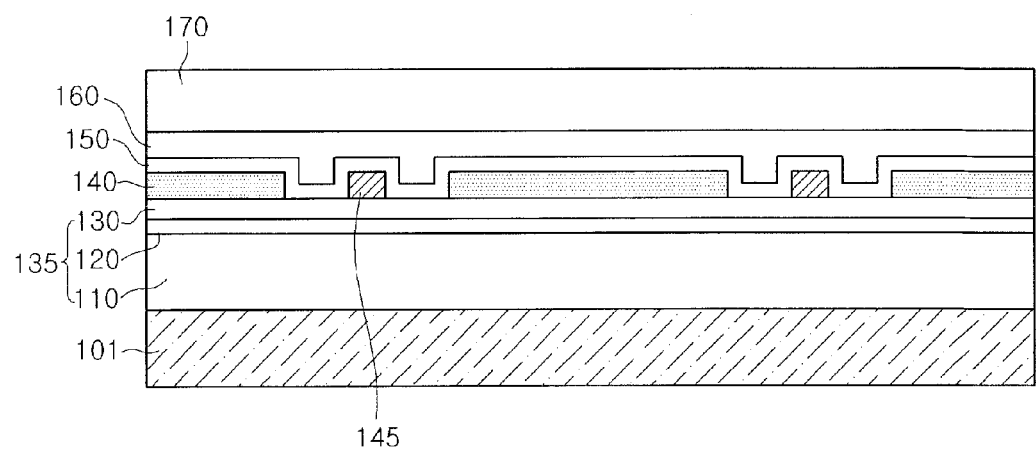

Referring to FIGS. 7 and 8, an adhesion layer 160 may be formed on the reflective layer 150. The adhesion layer 160 may include a barrier metal or a bonding metal. For example, the adhesion layer 160 may be formed of at least one selected from the group consisting of Ti, Au, Sn, Ni, Cr, Ga, In, Bi, Cu, Ag, and Ta.

A conductive support member 170 may be formed on the adhesion layer 160. The conductive support member 170 may be a base substrate formed using, for example, copper (Cu), aurum (Au), nickel (Ni), molybdenum (Mo), copper-tungsten (Cu—W), or a carrier wafer (e.g., Si, Ge, GaAs, ZnO, SiC, GaN, and SiGe). The conductive support member 170 may be bonded to the adhesion layer 160, may be formed of a plating layer, or may be adhered by a conductive sheet. In one embodiment, the adhesion layer 160 may not be formed. In this case, the conductive support member 170 may be formed on the reflective layer 150.

Figure 9:
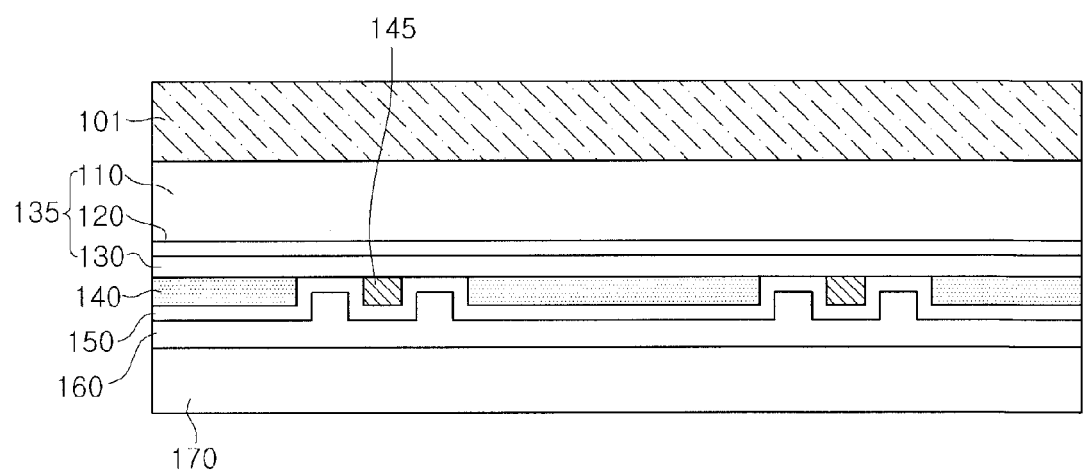
Figure 10:
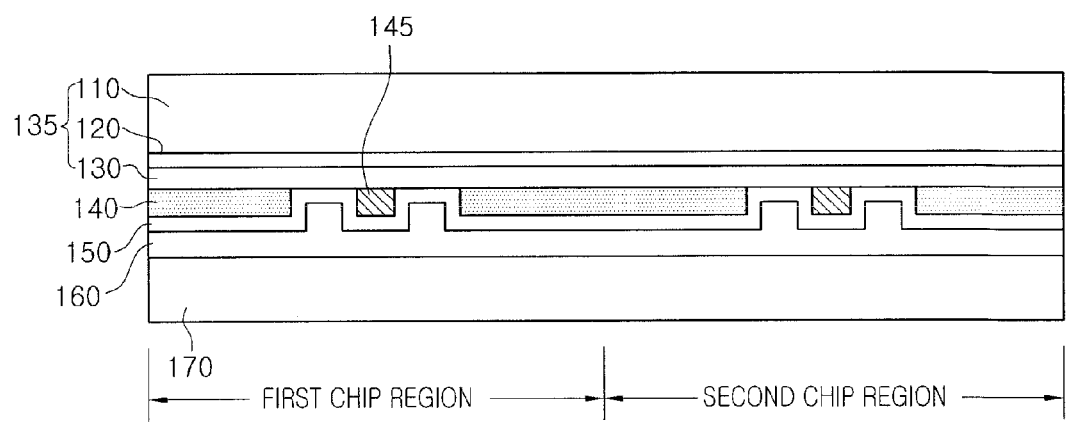

Referring to FIGS. 9 and 10, the conductive support member 170 may be turned to become the base, and the substrate 101 on the light-emitting structure 135 removed. For example, the substrate 101 may be removed using, for example, a Laser Lift Off (LLO) process. The LLO process may irradiate a laser beam of a predetermined wavelength onto the substrate 101 to remove the substrate 101. Herein, if another semiconductor layer (for example, a buffer layer) or an air gap is present between the substrate 101 and the first conductivity type semiconductor layer 110, the substrate 101 may be removed using a wet etchant.

A polishing process based on ICP/RIE (Inductively coupled Plasma/Reactive Ion Etching) may be performed on the surface of the first conductivity type semiconductor layer 110 removed of the substrate 101.

Figure 11:
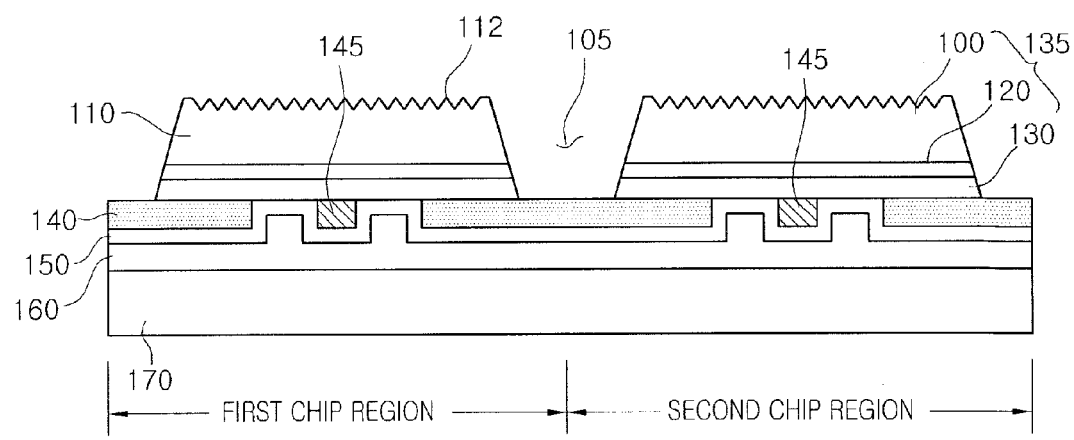

Referring to FIGS. 10 and 11, the channel region 105 of the light-emitting structure 135 may be removed using, for example, an isolation etching process. That is, an isolation etching process may be performed on an inter-chip boundary region. By the isolation etching process, the channel layer 140 may be exposed to the channel region 105 and a side of the light-emitting structure 135 may be inclined.

If the channel layer 140 is formed of a transparent material, laser beams irradiated in the isolation etching process or the laser scribing process may be transmitted therethrough, thereby suppressing the below metal materials (for example, the materials of the reflective layer 150, the adhesion layer 160, and the conductive support member 170) from being fragmented or projected in the laser irradiation direction. The channel layer 140 may transmit the laser beams, thereby making it possible to prevent metal fragments from being generated by the laser beams in the channel region 105 and to protect an outer wall of each layer of the light-emitting structure 135.

Thereafter, an etching process may be performed on a top surface of the first conductivity type semiconductor layer 110 to form a roughness pattern thereon. The roughness pattern may improve light extraction efficiency.

Figure 12:
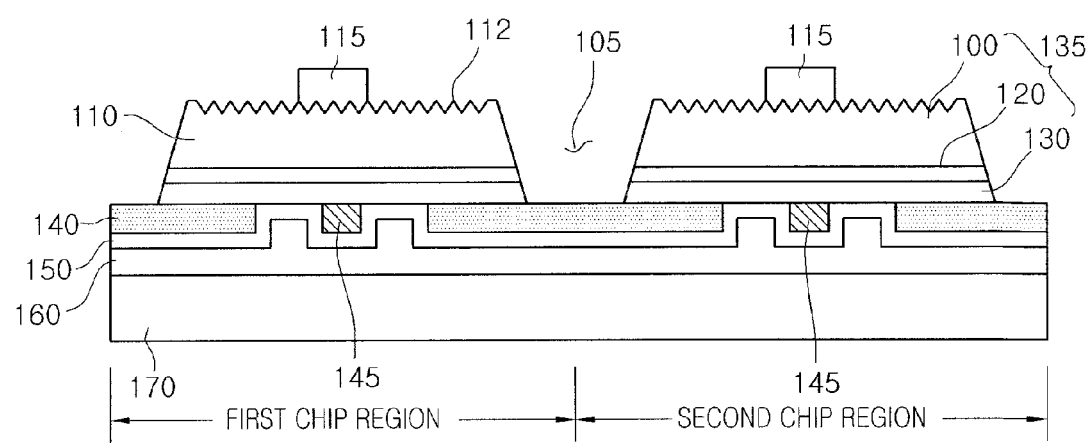
Figure 13:
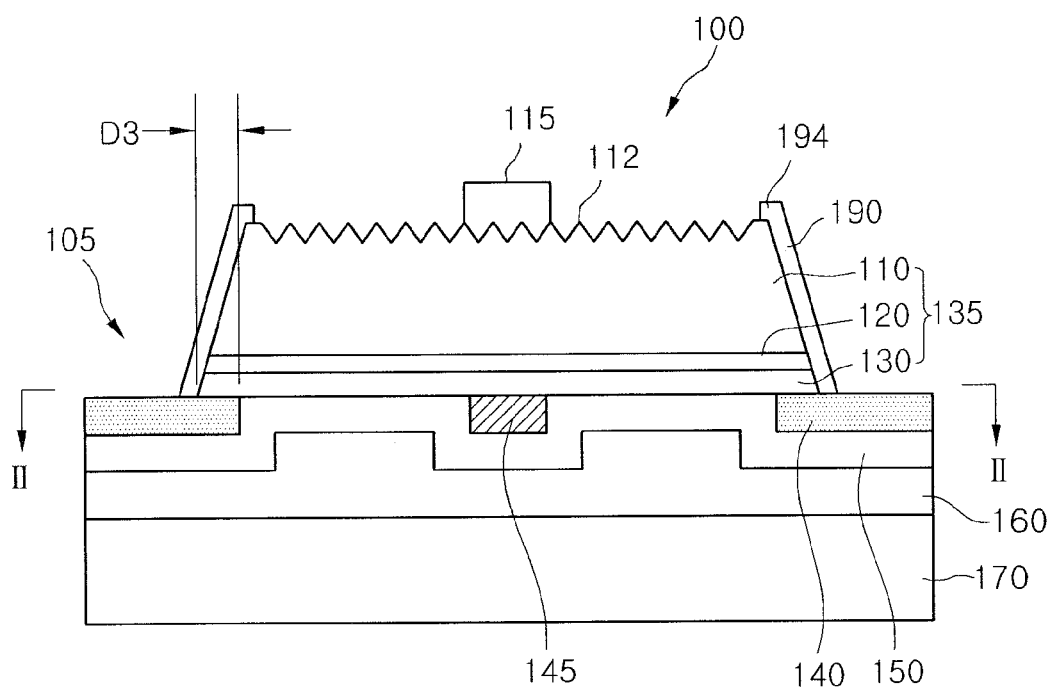

Referring to FIGS. 12 and 13, an insulating 190 may be formed around the light-emitting structure 135, wherein a bottom portion may be formed on the channel layer 140 and a top portion 194 may be formed around a top surface of the first conductivity type semiconductor layer 110. The insulating layer 190 may be formed around the light-emitting structure 135, thus making it possible to prevent a short between the layers 110, 120 and 130. Also, the insulating layer 180 and the channel layer 140 may prevent moisture from infiltrating into the chip.

An electrode 115 may be formed on the first conductivity type semiconductor layer 110. The electrode 115 may be formed in a predetermined pattern. The forming of the insulating layer 190 and the electrode 115 may be performed before or after chip separation; however, embodiments are not limited thereto. The electrode 115 may be formed to correspond to a position of the current blocking layer 145, and a roughness pattern may be formed in a top surface of the electrode 115; however, embodiments are not limited thereto.

Thereafter, the resulting structure may be separated into separate chip units by a chip boundary. The chip separation may be performed, for example, a laser or a breaking process. A sectional view taken along a line II-II of FIG. 13 is the same as FIG. 2.

Figure 14:
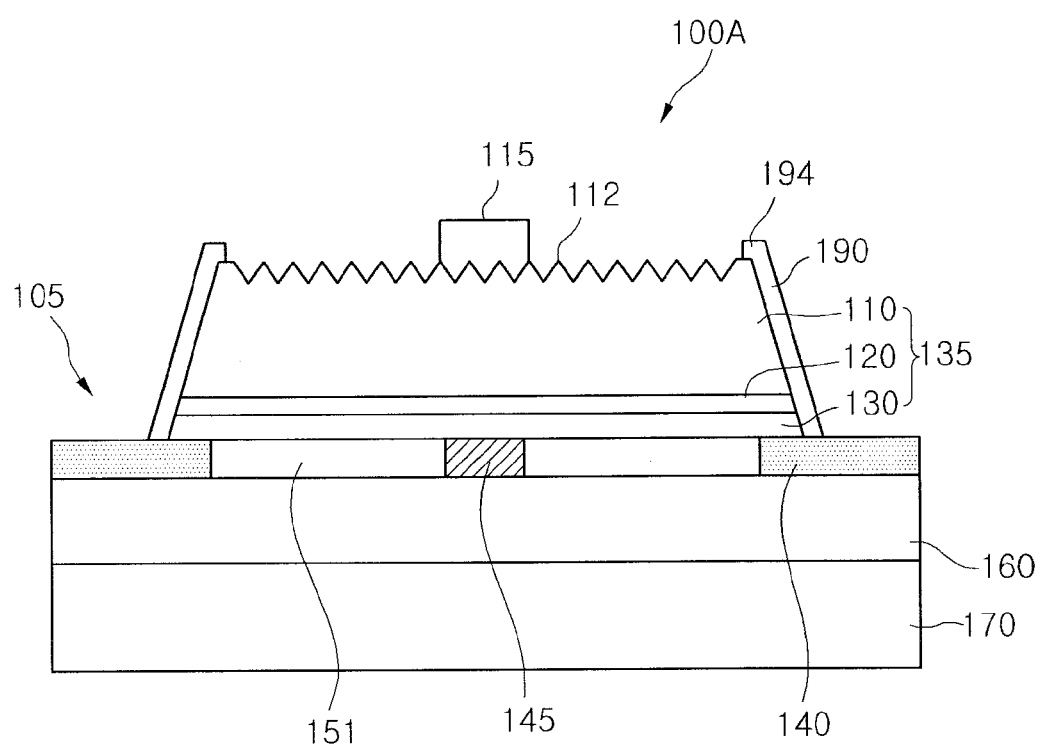
FIG. 14 is a sectional view of a semiconductor light-emitting device according to another embodiment.

FIG. 14 is a sectional view of a semiconductor light-emitting device according to another embodiment. In describing the embodiment of FIG. 14, repetitive description overlapping with the embodiment of FIG. 1 has been omitted.

Referring to FIG. 14, a semiconductor light-emitting device 100A may include a channel layer 140, a current blocking layer 145, and a reflective layer 151 that are disposed under a second conductivity type semiconductor layer 130. The channel layer 140, the current blocking layer 145, and the reflective layer 151 may be formed not to overlap each other.

An adhesion layer 160 and/or a conductive support member 170 may be formed under the channel layer 140, the reflective layer 151, and the current blocking layer 145. The adhesion layer 160 may contact bottoms of the channel layer 140, the reflective layer 151, and the current blocking layer 145. The channel layer 140 may provide a predetermined interval between the adhesion layer 160 and an outside or outer wall of the light-emitting structure 135. The reflective layer 151 may ohmic-contact the second conductivity type semiconductor layer 130 in an inner region of the channel layer 140. The current blocking layer 145 may be formed in a pattern corresponding to the electrode 115 in the reflective layer 151. The reflective layer 151 may be formed only in the ohmic contact region, so that the ohmic contact region and the reflective region may be formed to have the same size.

Figure 15:
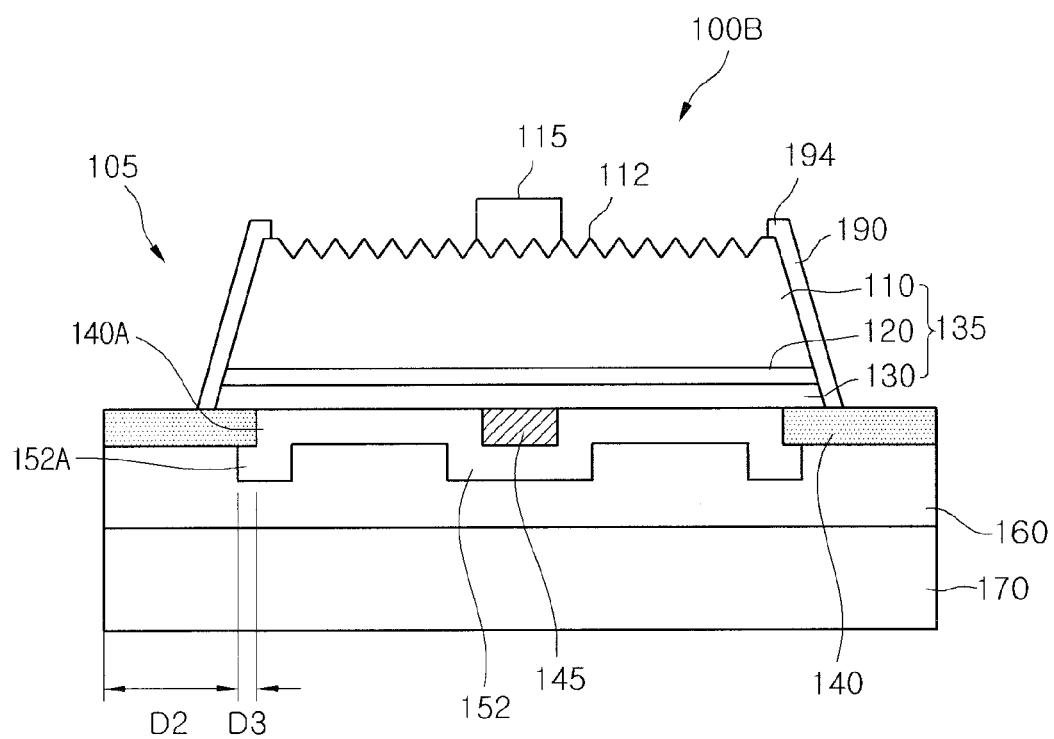
FIG. 15 is a sectional view of a semiconductor light-emitting device according to another embodiment.

FIG. 15 is a sectional view of a semiconductor light-emitting device according to another embodiment. In describing the embodiment of FIG. 15, repetitive description overlapping with the embodiment of FIG. 1 has been omitted.

Referring to FIG. 15, a semiconductor light-emitting device 100B may have a modified adhesion structure of a reflective layer 152 and a channel layer 140 under a light-emitting structure 135. An outer end 152A of the reflective layer 152 may overlap with an inner end 140A of the channel layer 140 by a predetermined amount or distance (or width) D3. Also, the outer end 152A of the reflective layer 152 may be spaced apart by a predetermined distance D2 from the outer wall of the chip. Therefore, it may not be exposed at the outer wall of the chip, thus making it possible to overcome the problem of exfoliation at the outer wall of the chip.

The overlap distance D3 of the reflective layer 152 with the bottom of the channel layer 140 may be less than approximately 80% of the bottom width (D2+D3) of the channel layer 140. Because the overlap distance D3 of the reflective layer 152 is reduced, the problem of a decrease in adhesive force by the material of the reflective layer 152 may be reduced. For example, if the width (D2+D3) of the channel layer 140 is about 75 the overlap distance D3 may be less than about 6 μm.

Figure 16:
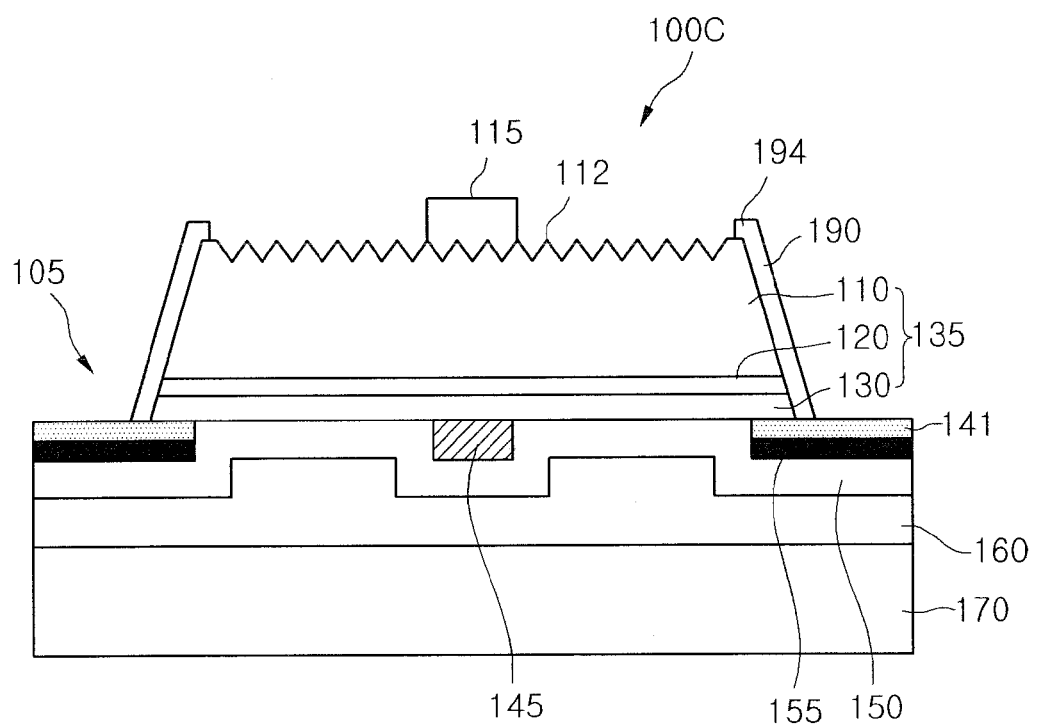
FIG. 16 is a sectional view of a semiconductor light-emitting device according to another embodiment.

FIG. 16 is a sectional view of a semiconductor light-emitting device according to another embodiment. In describing the embodiment of FIG. 16, repetitive description overlapping with the embodiment of FIG. 1 has been omitted.

Referring to FIG. 16, a semiconductor light-emitting device 100C may have a stack structure of a channel layer 141 and a capping layer 155 in a channel region 105. An inner side of the channel layer 141 may contact the bottom of the second conductivity type semiconductor layer 130 and an outer side of the channel layer 141 may be exposed to the outside of the chip. The channel layer 141 may be formed, for example, of oxide-based materials in this embodiment. For example, the channel layer 141 may be formed of at least one selected from the group consisting of ITO, IZO, IZTO, IAZO, IGZO, IGTO, AZO, ATO, GZO, $SiO_2$, $SiO_x$, $Al_2O_3$, and $TiO_2$.

The capping layer 155 may be formed, for example, of a metal having a good adhesive force with an oxide, for example, at least one selected from the group consisting of Ti, Ni, Pt, Pd, Cu, Al, Ir, and Rh. That is, the capping layer 155 may be, for example, a single-layer or multi-layer adhesive layer using the above materials, which may increase the adhesive force between the metal and the oxide material, thus reducing the problem of exfoliation at the outer wall of the chip. The capping layer 155 may be formed to a thickness of less than a few hundreds of nm. The capping layer 155 may be formed using, for example, an e-beam deposition process or a sputtering process; however, embodiments are not limited thereto.

The capping layer 155 may be formed between the reflective layer 150 and the bottom surface of the channel layer 141 to increase the adhesive force of the reflective layer 150, thus reducing the problem of interlayer exfoliation at the outer wall of the chip.

Figure 17:
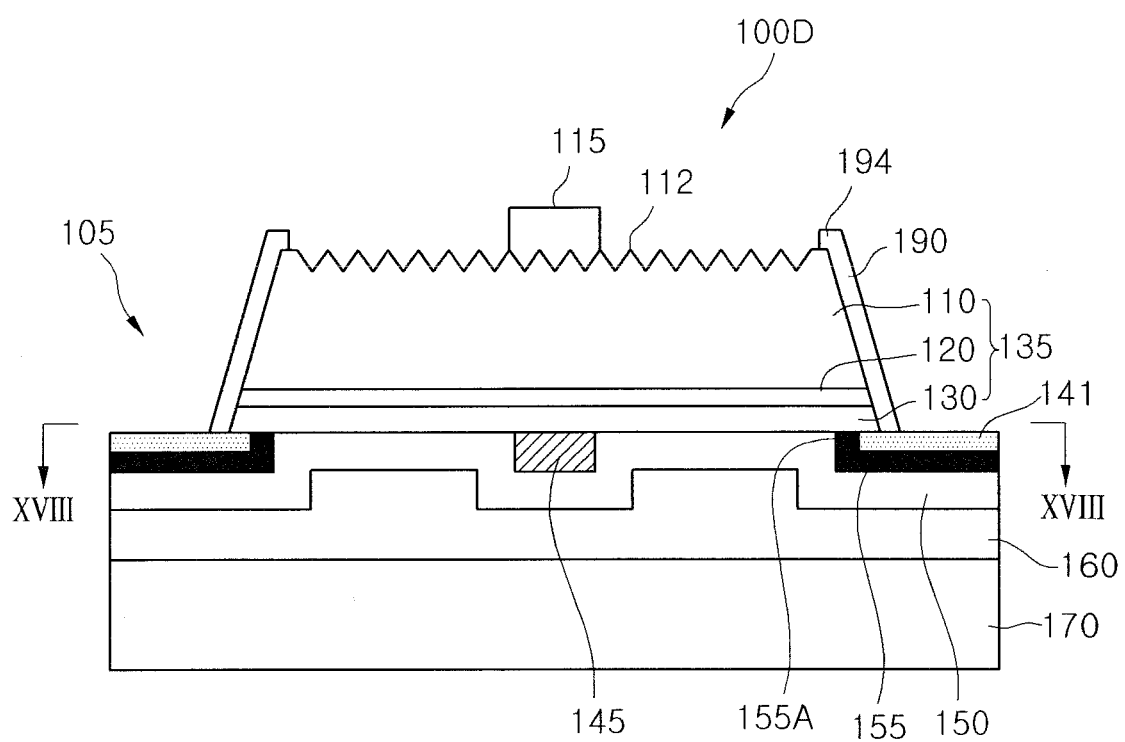
FIG. 17 is a sectional view of a semiconductor light-emitting device according to another embodiment.
Figure 18:
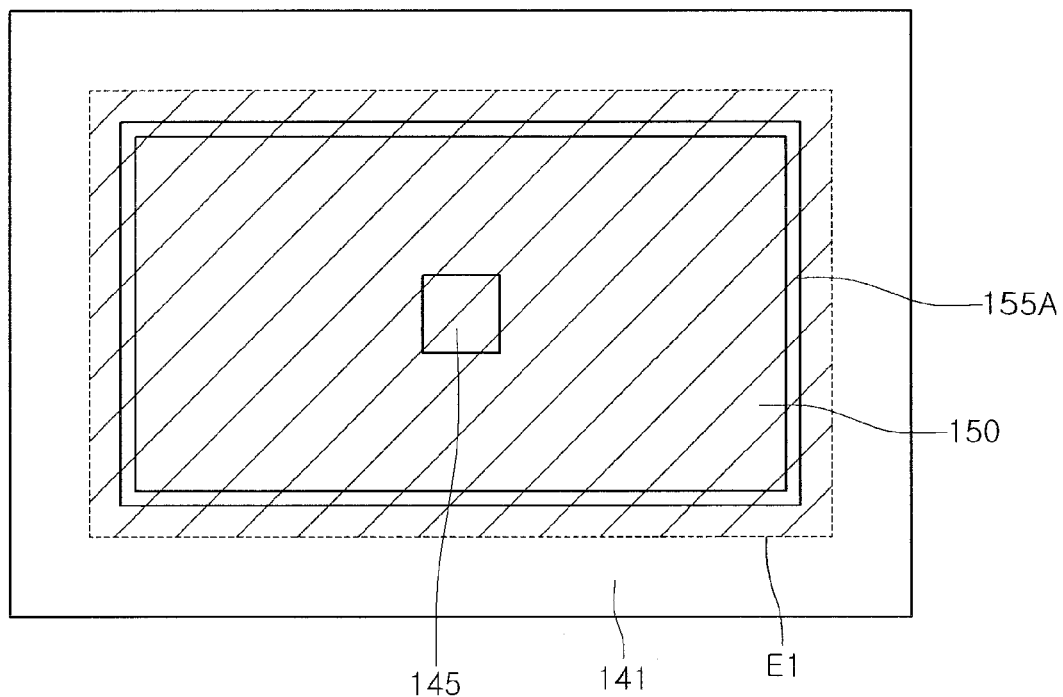
FIG. 18 is a sectional view of the semiconductor light-emitting device taken along a line XVIII-XVIII of FIG. 17.

FIG. 17 is a sectional view of a semiconductor light-emitting device according to another embodiment. FIG. 18 is a sectional view taken along a line XVIII-XVIII of FIG. 17. In describing the embodiment of FIG. 17, repetitive description overlapping with the above described embodiments has been omitted.

Referring to FIGS. 17 and 18, a semiconductor light-emitting device 100D may have a capping layer 155 surrounding a bottom edge of a channel layer 141. A channel layer 141 may be formed at a bottom outer side of the light-emitting structure 135, and the capping layer 155 may be disposed under the channel layer 141. The channel layer 141 may be formed, for example, in a ring or band pattern with a predetermined width along the chip. The capping layer 155 may be formed in a bottom surface and an inner surface of the channel layer 141. As illustrated in FIG. 18, an inner end 155A of the capping layer 155 may be formed, for example, in a ring or band pattern along a region between the reflective layer 150 and the channel layer 141. In FIG. 18, 'E1' denotes a semiconductor region.

The second conductivity type semiconductor layer 130 may contact the reflective layer 150, the channel layer 141, a current blocking layer 145, and the capping layer 155. Therefore, the second conductivity type semiconductor layer 130 may be protected by the channel layer 141 outside of the chip and may be supplied with a current through the reflective layer 150 and the capping layer 155 inside of the chip.

Figure 19:
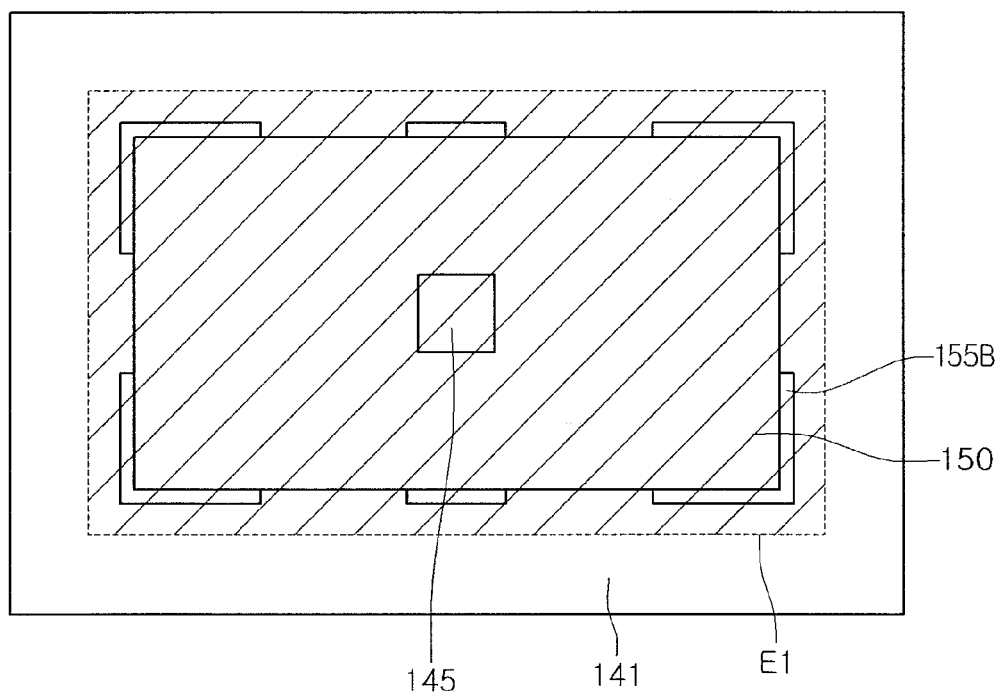
FIG. 19 is a sectional view illustrating a modified embodiment of the semiconductor light-emitting device of FIG. 18.

FIG. 19 is a modification of FIG. 18. Referring to FIGS. 17 and 19, an end portion 155B of the capping layer 155 may be formed to have a plurality of patterns (not a single pattern). That is, the end portion 155B of the capping layer 155 may be separated at regular intervals or at irregular intervals to contact the bottom surface of the second conductivity type semiconductor layer 130 in a roughness structure. This adhesion structure can increase the adhesive force of the capping layer 155 and the reflective layer 150 with respect to the channel layer 141. Some or all of the capping layers 155 may be formed to have a plurality of patterns.

Figure 20:
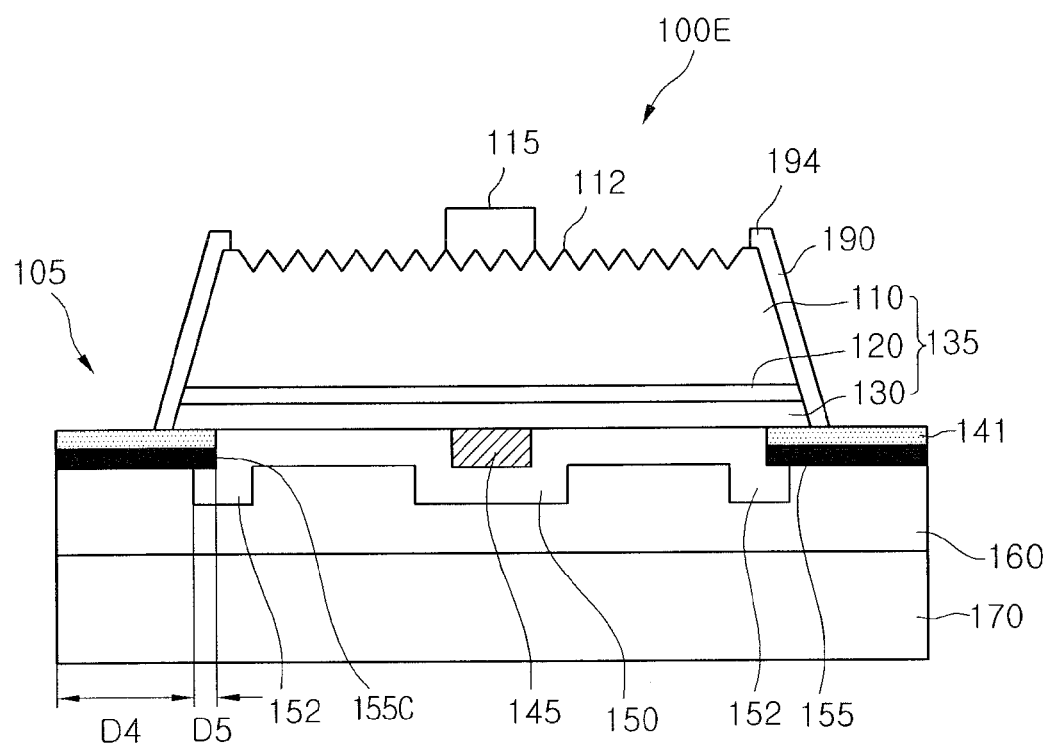
FIG. 20 is a sectional view of a semiconductor light-emitting device according to another embodiment.

FIG. 20 is a sectional view of a semiconductor light-emitting device according to another embodiment. In describing the embodiment of FIG. 20, repetitive description overlapping with the above described embodiments has been omitted.

Referring to FIG. 20, a semiconductor light-emitting device 100E may have a modified adhesion structure of a channel layer 141, a capping layer 155, and a reflective layer 150 disposed in a channel region 105. The reflective layer 150 may be formed to be narrower than the reflective layer of FIG. 16. An outer end 152 of the reflective layer 150 may overlap with the bottom of an inner end 143 of the capping layer 155 by a predetermined amount or distance (or width) D5. The overlap distance D5 may be less than approximately 80% of the width (D4+D5) of the capping layer 155, and an outer end of the reflective layer 150 may be spaced apart by a predetermined distance D4 from the outer wall of the chip. The capping layer 155 may be formed under the channel layer 141 to have the same width (D4+D5) as the channel layer 144, or may be formed to be narrower than the channel layer 141.

Figure 21:
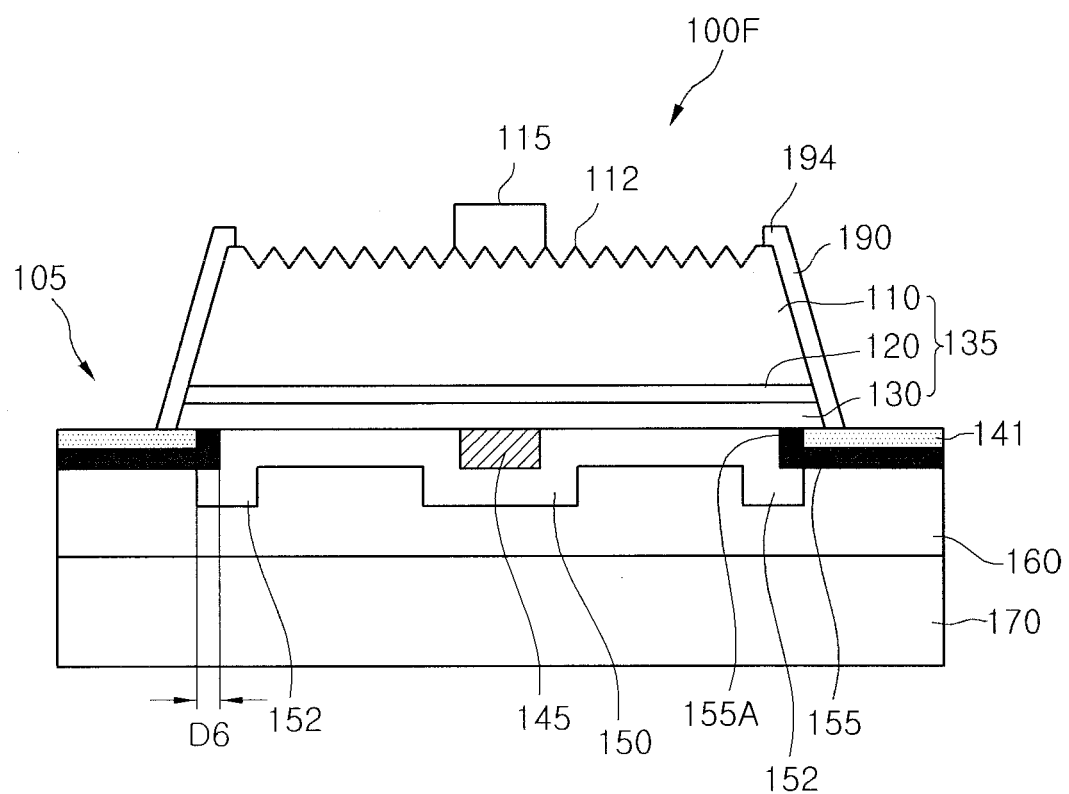
FIG. 21 is a sectional view of a semiconductor light-emitting device according to another embodiment.

FIG. 21 is a sectional view of a semiconductor light-emitting device according to another embodiment. In describing the embodiment of FIG. 21, repetitive description overlapping with the above described embodiments has been omitted.

Referring to FIG. 21, a semiconductor light-emitting device 100F may include a channel layer 141, a capping layer 155, and a reflective layer 150 that are formed around the bottom of a light-emitting structure 135. An inner top surface of the channel layer 141 may contact the bottom surface of the second conductivity type semiconductor layer 130, and the bottom surface and the inner surface of the channel layer 141 may be covered with the capping layer 155. An inner end 155A of the capping layer 155 may contact the bottom surface of the second conductivity type semiconductor layer 130 to supply a current. An outside or outer edge of the reflective layer 150 may contact the capping layer 155 and may not contact the channel layer 141, thus improving adhesive force for the outside of the reflective layer 150.

Also, an end portion 152 of the reflective layer 152 may be disposed to overlap with the bottom of the capping layer 155 by a predetermined distance D6. Herein, the overlap distance D6 may be less than approximately 80% of the width of the channel layer 141. Because the end portion 152 of the reflective layer 152 may be disposed to overlap with the bottom of the capping layer 155, the adhesive force of the reflective layer 152 with the end portion 152 may be increased.

Figure 22:
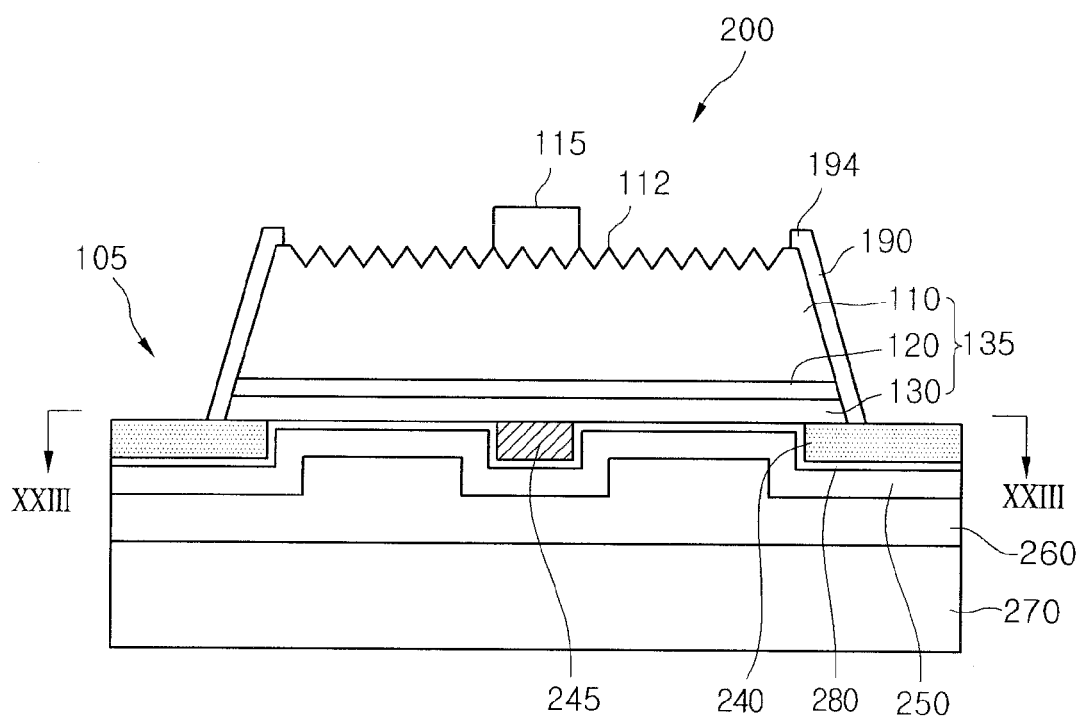
FIG. 22 is a sectional view of a semiconductor light-emitting device according to another embodiment.

FIG. 22 is a sectional view of a semiconductor light-emitting device according to another embodiment. In describing the embodiment of FIG. 22, repetitive description overlapping with the above described embodiments has been omitted.

Referring to FIG. 22, a semiconductor light-emitting device 200 may include a light-emitting structure 135, a channel layer 240, a current blocking layer 245, a reflective layer 250, an adhesion layer 260, a conductive support member 270, and an ohmic layer 280. The channel layer 240 may be disposed around the bottom of the second conductivity type semiconductor layer 130, and the ohmic layer 280 and the current blocking layer 245 may be disposed inside the second conductivity type semiconductor layer 130. The channel layer 240 may be the same as that of the embodiment of FIG. 1. The current blocking layer 245 may be formed between the second conductivity type semiconductor layer 130 and the ohmic layer 280 to diffuse a current.

The ohmic layer 280 may be formed between the reflective layer 250 and the second conductivity type semiconductor layer 130 of a light-emitting structure 135. The ohmic layer 280 may be formed, for example, of a conductive oxide material selected from the group consisting of ITO, IZO, IZTO, IAZO, IGZO, IGTO, AZO, ATO, GZO, and a combination thereof. That is, the ohmic layer 280 may contact the bottom surface of the second conductivity type semiconductor layer 130. The ohmic layer 280 may be formed, for example, using a sputtering process (for example, radio-frequency-magnetron sputtering) or a deposition process; however, embodiments are not limited thereto. The ohmic layer 280 may be formed to a thickness of less than several nm; however, embodiments are not limited thereto.

The ohmic layer 280 may contact bottoms of the channel layer 240, the second conductivity type semiconductor layer 130, and the current blocking layer 245 to supply a current, applied through the adhesion layer 260, to the second conductivity type semiconductor layer 130. For example, the reflective layer 250 may be formed to have a stack structure of a first adhesion layer/a reflective layer/a second adhesion layer/a seed layer. The first and second adhesion layers may include Ni, the reflective layer may include Ag, and the seed layer may include Cu. The first adhesion layer may be formed to a thickness of less than several nm, the reflective layer may be formed to a thickness of less than hundreds of nm, the second adhesion layer may be formed to a thickness of less than tens of nm, and the seed layer may be formed to a thickness of less than 1 μm; however, embodiments are not limited thereto.

Figure 23:
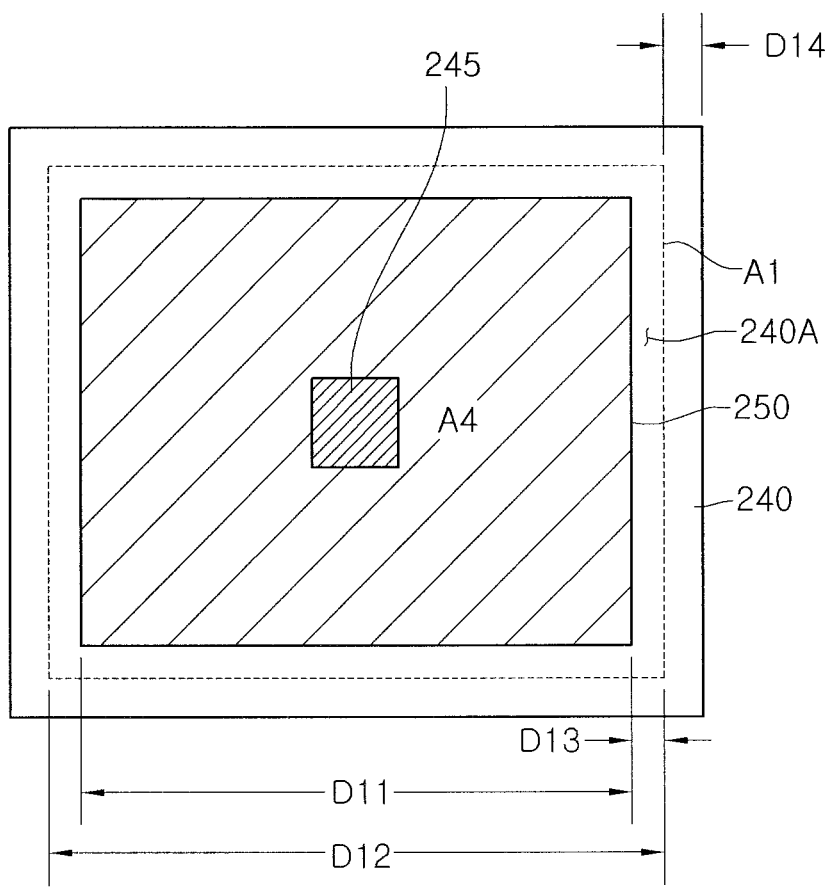
FIG. 23 is a sectional view of the semiconductor light-emitting device taken along a line XXIII-XXIII of FIG. 22.

FIG. 23 is a sectional view taken along line XXIII-XXIII of FIG. 22. Referring to FIG. 23, an inner region 240A of the channel layer 240 may be disposed outside of a semiconductor region A1, and an ohmic region A4 of an ohmic layer 280 and a region of a current blocking layer 245 may be disposed inside of the semiconductor region A1. A width D12 of the semiconductor region A1 may be larger than a width D11 of the ohmic layer 280. The distances D14 and D13 of the inner region and the outer region of the channel layer 240 may be equal to or different from each other; however, embodiments are not limited thereto.

Figure 24:
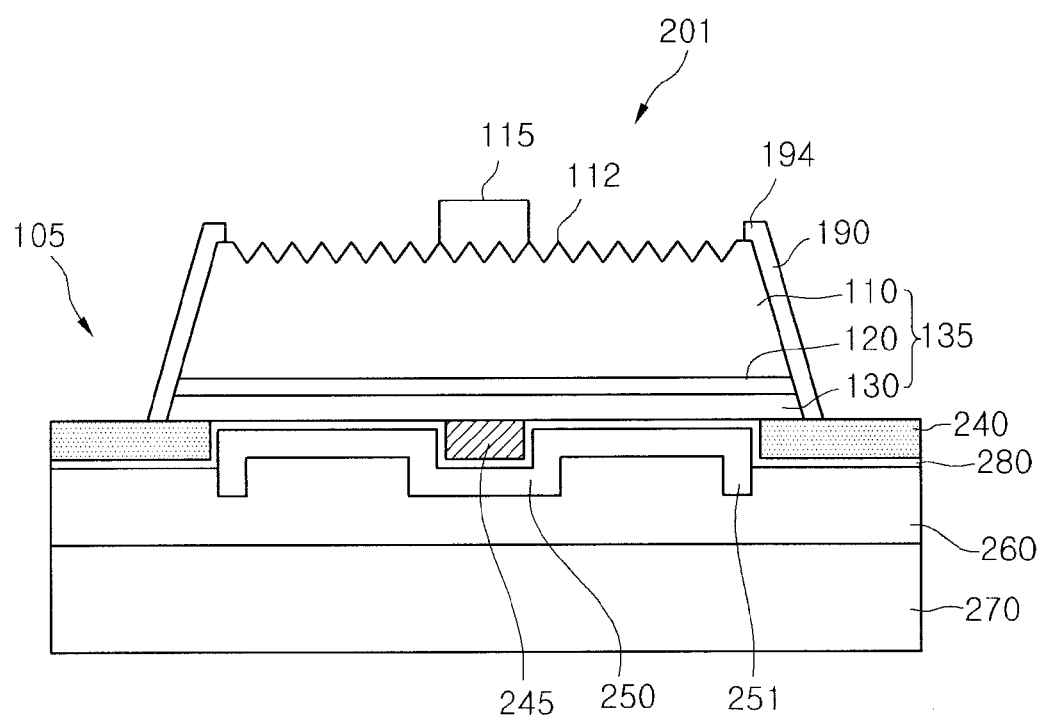
FIG. 24 is a sectional view of a semiconductor light-emitting device according to another embodiment.

FIG. 24 is a sectional view of a semiconductor light-emitting device according to another embodiment. In describing the embodiment of FIG. 24, repetitive description overlapping with the above described embodiments has been omitted.

Referring to FIG. 24, a semiconductor light-emitting device 201 may have a modified reflective layer 250. The reflective layer 250 may be disposed only in a region not a channel region 105 of the ohmic layer 280 (that is, only in an ohmic region) to reflect incident light. An outer end 251 of the reflective layer 250 may not be exposed outside of the chip.

Figure 25:
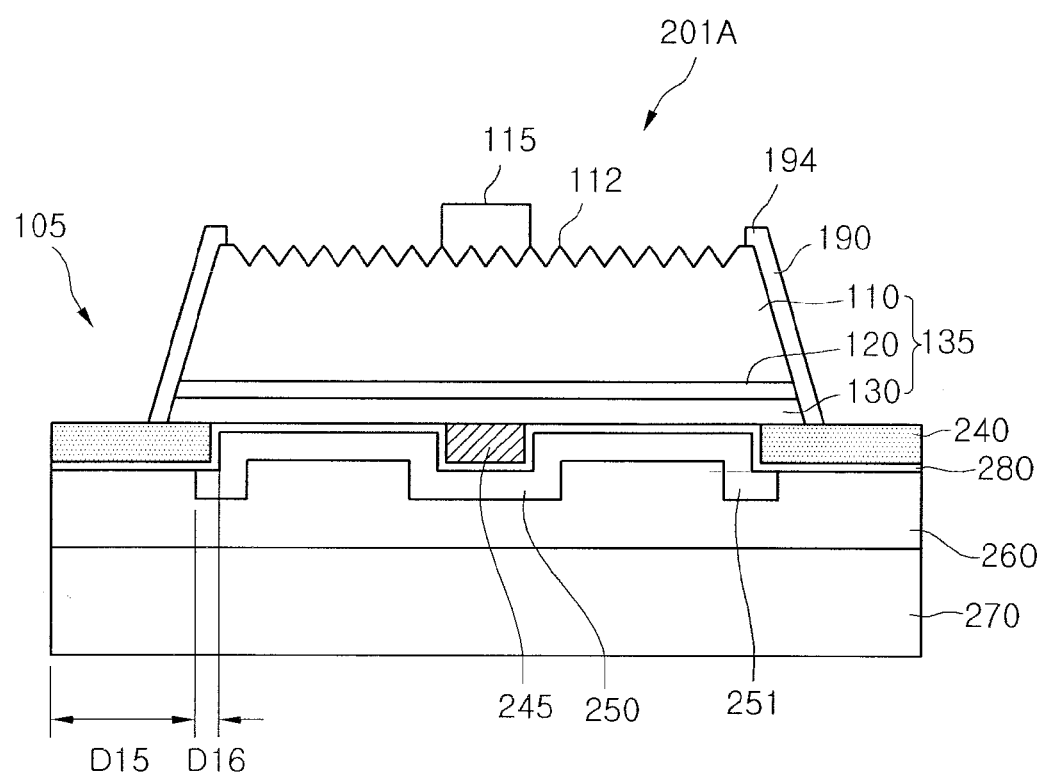
FIG. 25 is a sectional view of a semiconductor light-emitting device according to another embodiment.

FIG. 25 is a sectional view of a semiconductor light-emitting device according to another embodiment. In describing the embodiment of FIG. 25, repetitive description overlapping with the above described embodiments has been omitted.

Referring to FIG. 25, a semiconductor light-emitting device 201A may have a conductive oxide-based ohmic layer 280 formed to ohmic-contact a bottom of a light-emitting structure 135, and a transparent channel layer 240 formed at an outside of the light-emitting structure 135.

An end portion 251 of the reflective layer 250 may be formed to overlap with a channel region 105 by a predetermined distance D16. Herein, the overlap distance D16 may be less than approximately 80% of the bottom width (D15+D16) of the channel layer 240. That is, as illustrated in FIGS. 24 and 26, some or an entire reflective layer 250 may contact the ohmic layer 280 under a region of the channel layer 240.

Figure 26:
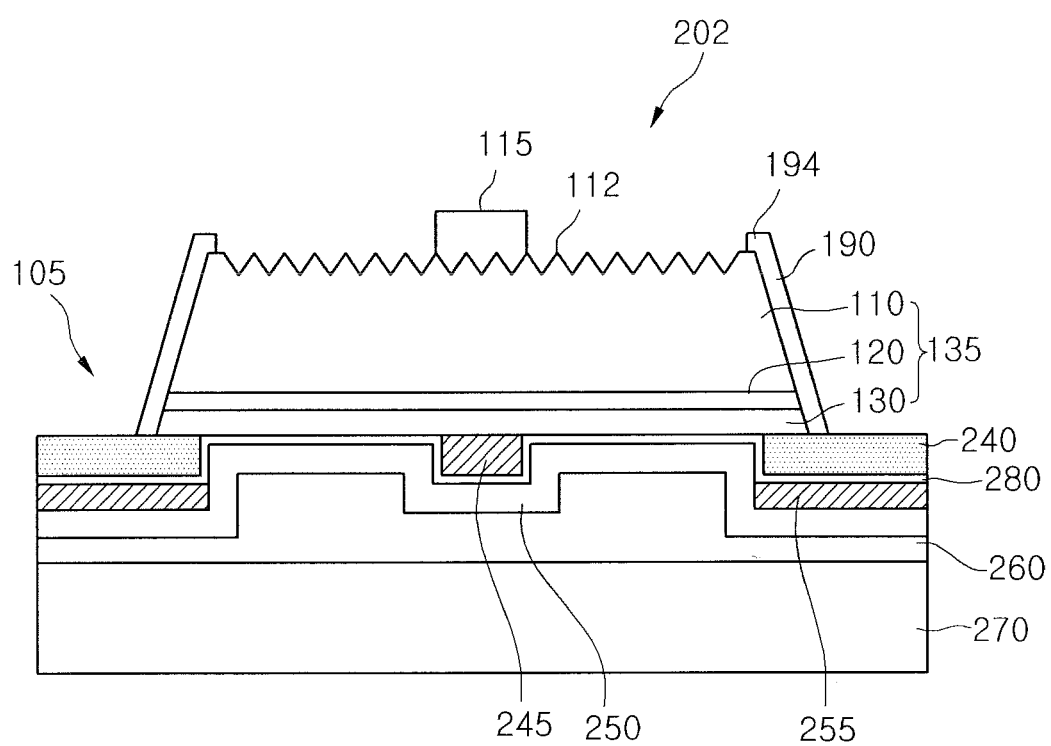
FIG. 26 is a sectional view of a semiconductor light-emitting device according to another embodiment.

FIG. 26 is a sectional view of a semiconductor light-emitting device according to another embodiment. In describing the embodiment of FIG. 26, repetitive description overlapping with the above described embodiments has been omitted.

Referring to FIG. 26, a semiconductor light-emitting device 202 may have a conductive oxide-based ohmic layer 280 formed to ohmic-contact a bottom of a light-emitting structure 135, and a transparent channel layer 240 formed at the outside of the light-emitting structure 135. A reflective layer 250 may be formed under the ohmic layer 280, and a capping layer 255 may be formed between the ohmic layer 280 and the reflective layer 250.

The capping layer 255 may be formed, for example, of a metal having a good adhesive force with an oxide, for example, one or more selected from the group consisting of Ti, Ni, Pt, Pd, Cu, Al, Ir, and Rh. That is, the capping layer 255 may be, for example, a single-layer or multi-layer adhesion layer using the above materials, which increases the adhesive force between the metal and the oxide material, thus reducing exfoliation at the outer wall of the chip.

The capping layer 255 may be formed between an outer bottom surface of the ohmic layer 240 and an outer top surface of the reflective layer 250 to increase the adhesive force of the reflective layer 250 with respect to the outside, thus reducing interlayer exfoliation at the outer wall of the chip. The outside of the reflective layer 250 may be formed to extend to the outside of the chip along the bottom surface of the capping layer 255.

Figure 27:
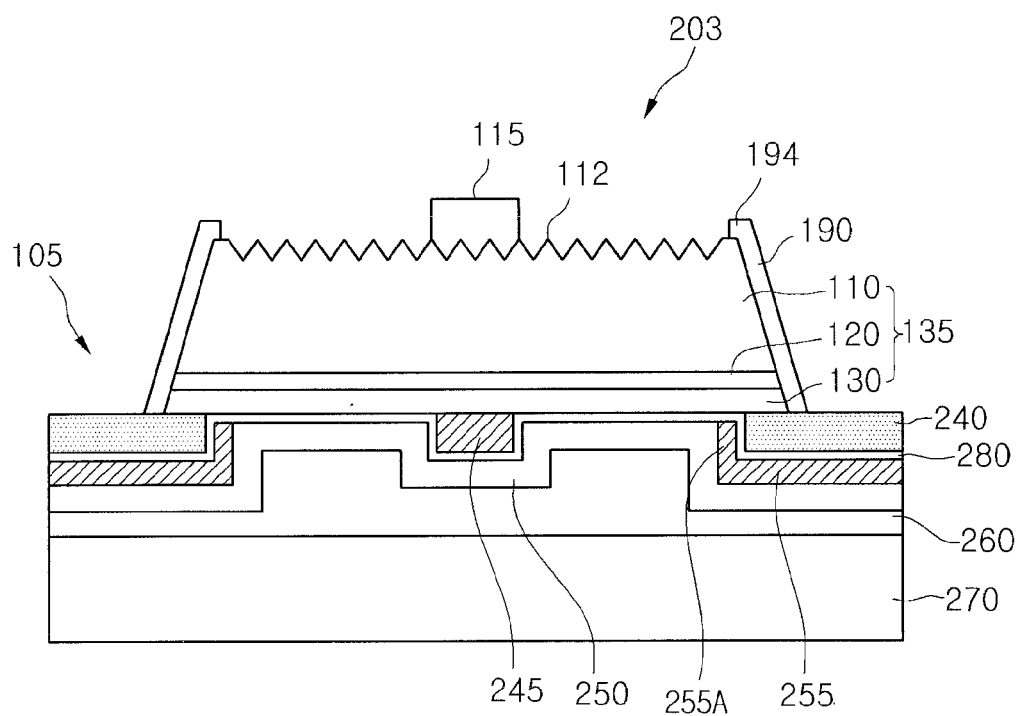
FIG. 27 is a sectional view of a semiconductor light-emitting device according to another embodiment.

FIG. 27 is a sectional view of a semiconductor light-emitting device according to another embodiment. In describing the embodiment of FIG. 27, repetitive description overlapping with the above described embodiments has been omitted.

Referring to FIG. 27, a semiconductor light-emitting device 203 may include an ohmic layer 280 formed under a channel layer 240, a capping layer 255 formed under the ohmic layer 280, and a reflective layer 250 formed under the capping layer 255 in a channel region 105. The capping layer 255 may be formed around an outer edge of the ohmic layer 280 to reduce a contact area with respect to the reflective layer 250. The ohmic layer 280 may be formed, for example, of a conductive oxide material. The capping layer 255 may be formed in an outer channel region 105 between the ohmic layer 280 and the reflective layer 250. The capping layer 255 may be formed, for example, of a metal having a good adhesive force with respect to the oxide material.

An inner end 255A of the capping layer 255 may be formed to extend to a portion of an ohmic contact region of the ohmic layer 280. Herein, the outside of the ohmic layer 280 may cover an edge of the channel layer 240, and the capping layer 255 may extend to a cover region of the ohmic layer 280 with respect to the channel layer 240.

Figure 28:
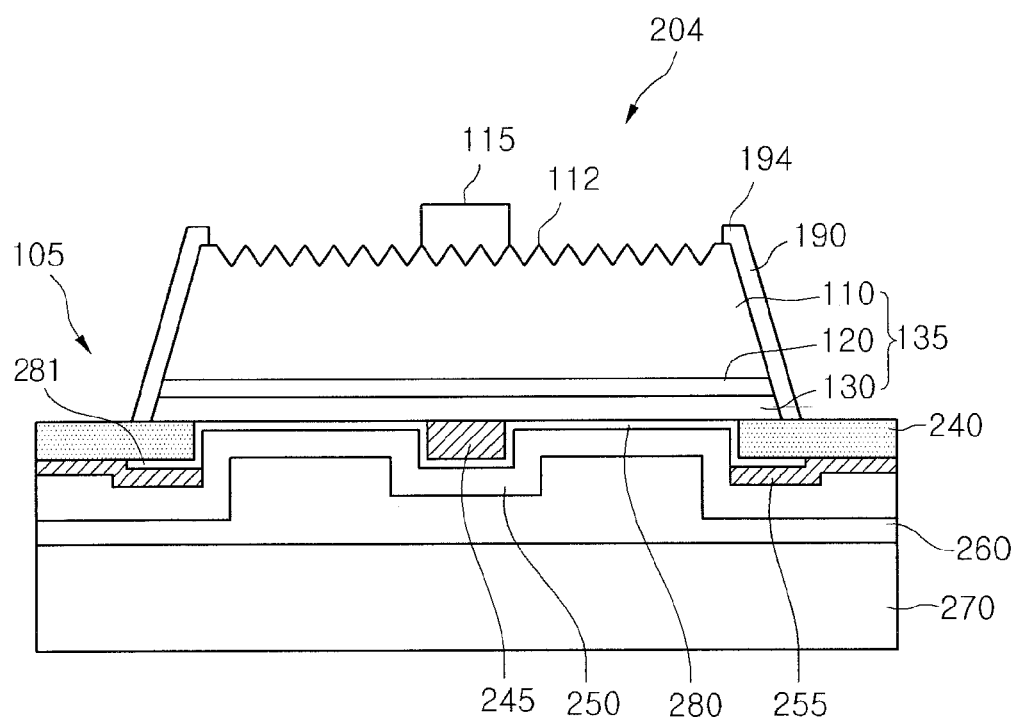
FIG. 28 is a sectional view of a semiconductor light-emitting device according to another embodiment.

FIG. 28 is a sectional view of a semiconductor light-emitting device according to another embodiment. In describing the embodiment of FIG. 28, repetitive description overlapping with the above described embodiments has been omitted.

Referring to FIG. 28, a semiconductor light-emitting device 204 may have a stack structure of a channel layer 240, a capping layer 255, and an outer end 281 of an ohmic layer 280 disposed under the channel layer 240 in a channel region 105. The outer end 281 of the ohmic layer 280 may extend to an inner bottom side of the channel layer 240 and may not be exposed outside of the chip. The capping layer 255 may be formed under a bottom outside of the channel layer 240 and the outer end 281 of the ohmic layer 280. The capping layer 255 may contact bottoms of the ohmic layer 280 and the channel layer 240, thereby improving adhesive force of the reflective layer 250.

Figure 29:
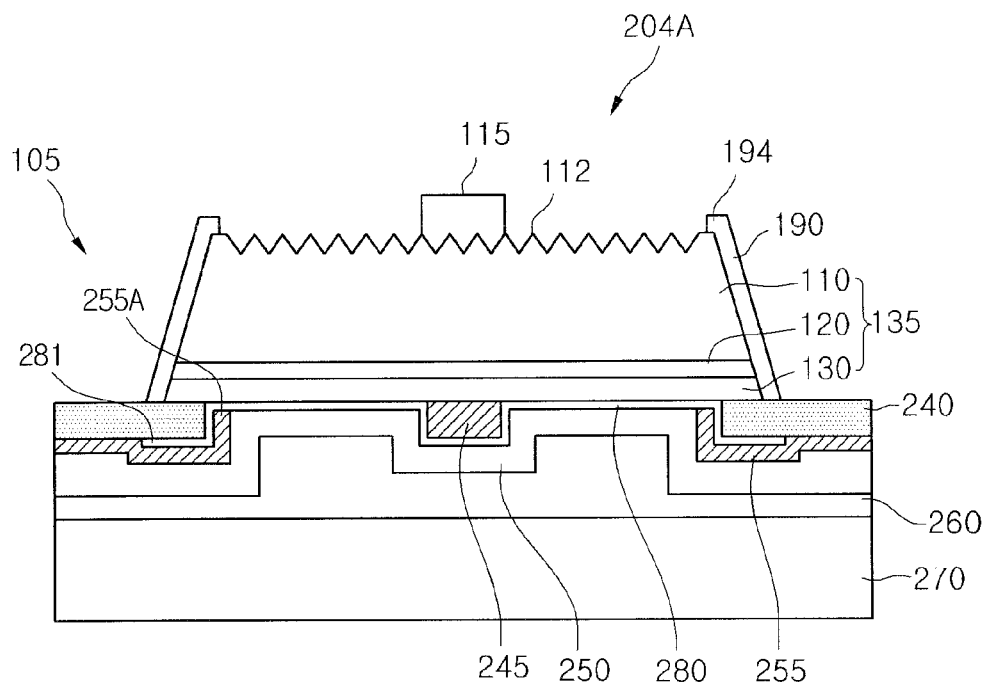
FIG. 29 is a sectional view of a semiconductor light-emitting device according to another embodiment.

FIG. 29 is a sectional view of a semiconductor light-emitting device according to another embodiment. In describing the embodiment of FIG. 9, repetitive description overlapping with the above described embodiments has been omitted.

Referring to FIG. 29, a semiconductor light-emitting device 204A may have a modified capping layer 255 of the channel region 105 in comparison with the semiconductor light-emitting device of FIG. 28. The capping layer 255 may be formed under a bottom outside of the channel layer 240 and an outer end 281 of the ohmic layer 280, and its inner end 255A may be formed to extend up a portion of an ohmic contact region of the ohmic layer 280. The ohmic contact region of the ohmic layer 280 may be a region contacting the second conductivity type semiconductor layer 130, and the ohmic layer 280 may be disposed between the end 255A of the capping layer 255 and the second conductivity type semiconductor layer 130.

The reflective layer 250 may contact the bottom of the capping layer 255 and may be exposed to the outer wall of the chip. The capping layer 255 may contact outer bottoms of the ohmic layer 280 and the channel layer 240, thereby improving adhesive force of the reflective layer 250.

Figure 30:
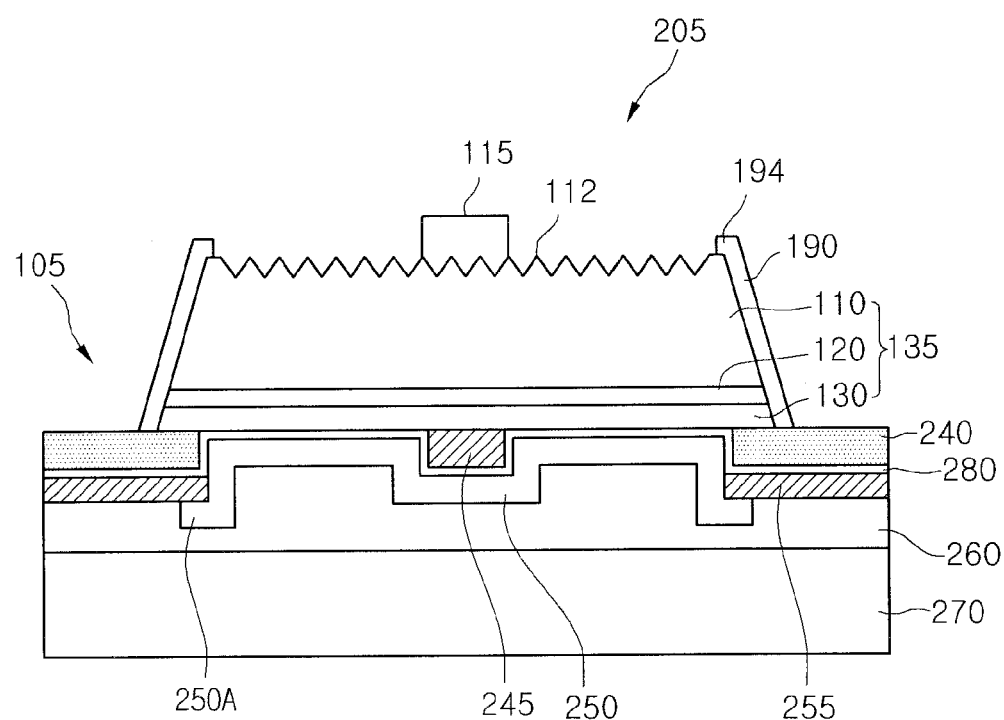
FIG. 30 is a sectional view of a semiconductor light-emitting device according to another embodiment.

FIG. 30 is a sectional view of a semiconductor light-emitting device according to another embodiment. In describing the embodiment of FIG. 30, repetitive description overlapping with the embodiment of FIG. 29 has been omitted.

Referring to FIG. 30, a semiconductor light-emitting device 205 may include an ohmic layer 280 formed at the bottom surface of a channel layer 240, a capping layer 255 formed under the outside of the ohmic layer 280, and a reflective layer 250 formed at a portion of the bottom of the capping layer 255. An end portion 250A of the reflective layer 250 may extend to a bottom inside of the capping layer 255 and may not be exposed to the outer wall of the chip. Accordingly, a decrease in adhesive force in the end portion 250A of the reflective layer 250 may be prevented.

Figure 31:
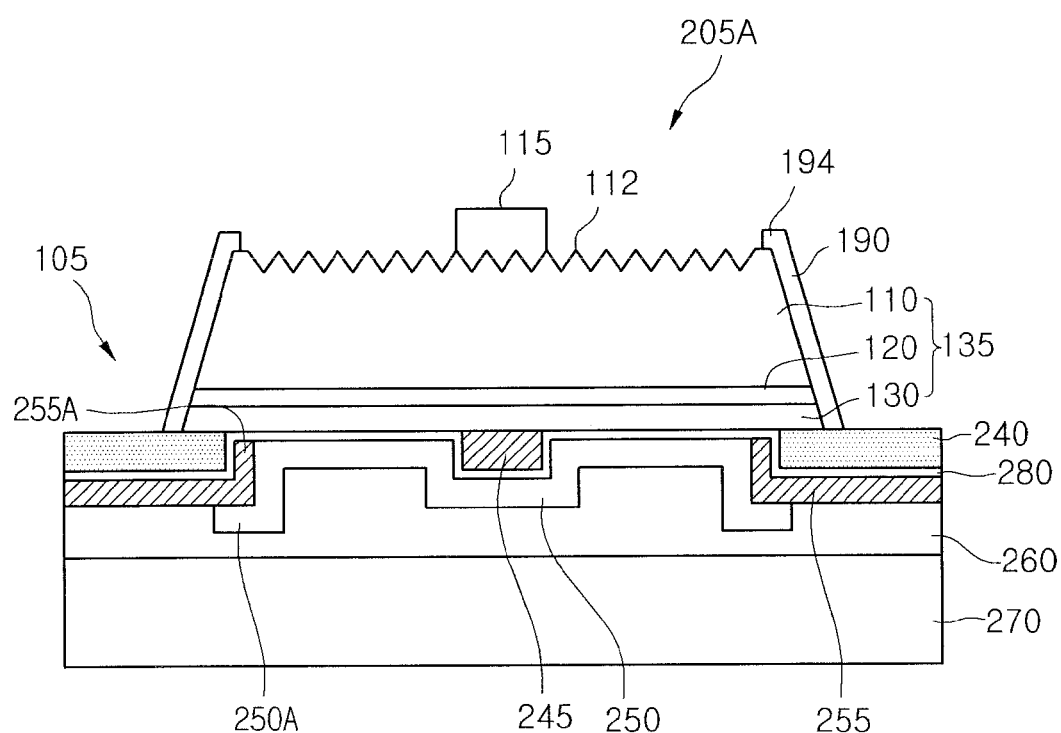
FIG. 31 is a sectional view of a semiconductor light-emitting device according to another embodiment.

FIG. 31 is a sectional view of a semiconductor light-emitting device according to another embodiment. In describing the embodiment of FIG. 31, repetitive description overlapping with the embodiment of FIG. 30 has been omitted.

Referring to FIG. 31, a semiconductor light-emitting device 205A may include an ohmic layer 280 formed at the bottom surface of a channel layer 240, a capping layer 255 formed under the outside of the ohmic layer 280, and a reflective layer 250 extending to the bottom inside of the capping layer 255. The reflective layer 250 may be formed under the ohmic layer 280. An end portion 250A of the reflective layer 250 may extend to a bottom inside of the capping layer 255 and may not be exposed to the outer wall of the chip. Accordingly, a decrease in the adhesive force in the end portion 250A of the reflective layer 250 may be prevented.

An inner end 255A of the capping layer 255 may be formed to extend an ohmic contact region of the ohmic layer 280 to increase the contact area between the ohmic layer 280 and the reflective layer 250. The end portion 250A of the reflective layer 250 may be disposed to overlap with the bottom of the channel layer 240, and may be formed to have a width less than approximately 80% of the width of the channel layer 240.

Figure 32:
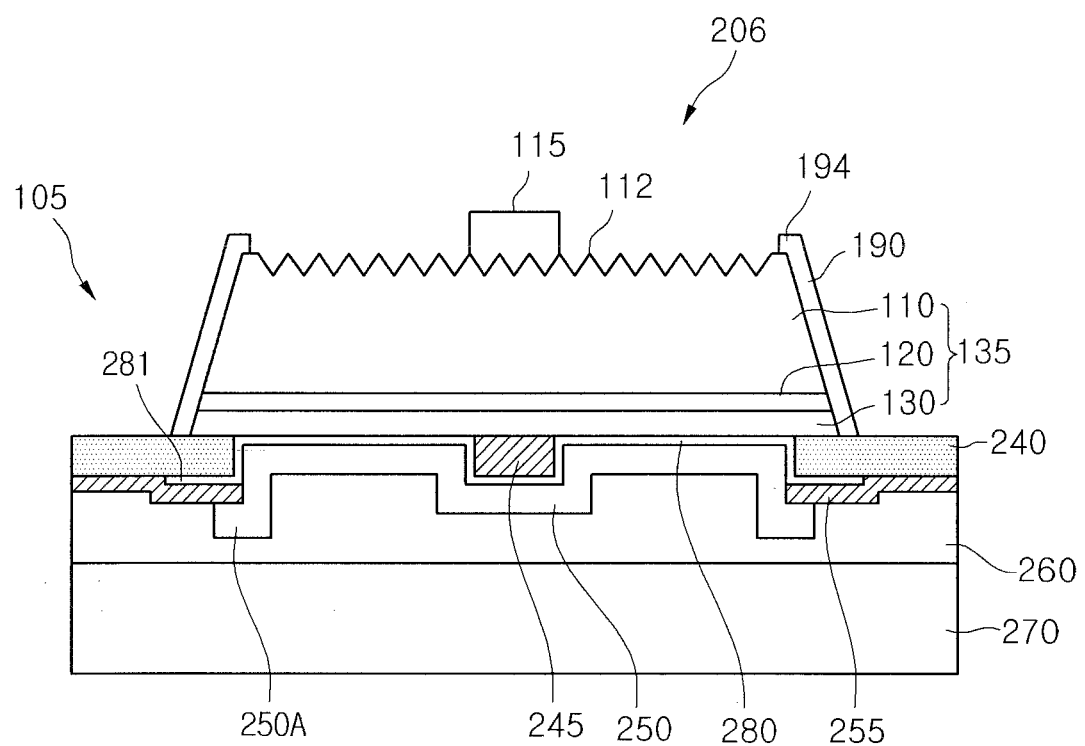
FIG. 32 is a sectional view of a semiconductor light-emitting device according to another embodiment.

FIG. 32 is a sectional view of a semiconductor light-emitting device according to another embodiment. In describing the embodiment of FIG. 32, repetitive description overlapping with the embodiment of FIG. 32 has been omitted.

Referring to FIG. 32, a semiconductor light-emitting device 206 may include a channel layer 240 formed under the outside of a light-emitting structure 135, an ohmic layer 280 formed under the second conductivity type semiconductor layer 130 and inside of the channel layer 240, and a capping layer 255 formed under the outside of the channel layer 240 and the outside of the ohmic layer 280. A reflective layer 250 may be formed under the ohmic layer 280 and inside of the capping layer 255.

The reflective layer 250 may extend to an inner bottom of the capping layer 255. The extending portion 250A may have a region overlapping with the channel layer 240, and a width of the overlap region may be less than approximately 80% of the bottom width of the channel layer 240.

An adhesive layer 260 and the outside of the reflective layer 250 may contact the bottom of the capping layer 255, thereby improving adhesive force of the reflective layer 250 and the adhesion layer 260.

Figure 33:
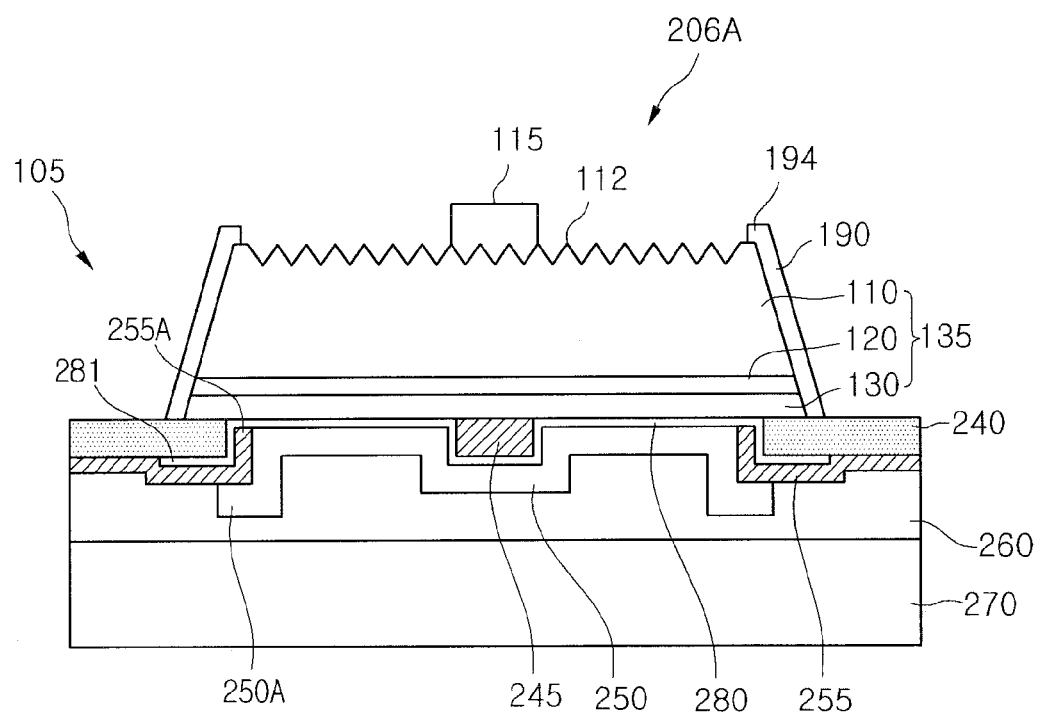
FIG. 33 is a sectional view of a semiconductor light-emitting device according to another embodiment.

FIG. 33 is a sectional view of a semiconductor light-emitting device according to another embodiment. In describing the embodiment of FIG. 33, repetitive description overlapping with the embodiment of FIG. 32 has been omitted.

Referring to FIG. 33, a semiconductor light-emitting device 206A may include a channel layer 240 formed under an outside of a light-emitting structure 135, an ohmic layer 280 formed under the second conductivity type semiconductor layer 130 and inside of the channel layer 240, and a capping layer 255 formed under the outside of the channel layer 240 and the outside 281 of the ohmic layer 280. A reflective layer 250 may be formed under the ohmic layer 280 and inside of the capping layer 255.

The reflective layer 250 may extend to the inner bottom of the capping layer 255. The extending portion 250A may have a region spatially overlapping with the channel layer 240, and a width of the overlap region may be less than approximately 80% of a bottom width of the channel layer 240.

An adhesion layer 260 and the outside of the reflective layer 250 may contact the bottom of the capping layer 255, thereby improving adhesive force of the reflective layer 250 and the adhesion layer 260.

An end portion 255A of the capping layer 255 may extend to an ohmic contact region of the ohmic layer 280 to reduce the contact area between the reflective layer 250 and the ohmic layer 280. Accordingly, the capping layer 255 may improve adhesive force between the reflective layer 250, the ohmic layer 280, and the adhesion layer 260.

FIGS. 34 to 42 are sectional views of semiconductor light-emitting devices according to additional embodiments. In describing the embodiment of FIG. 34, repetitive description overlapping with the embodiment of FIG. 1 has been omitted.

Figure 34:
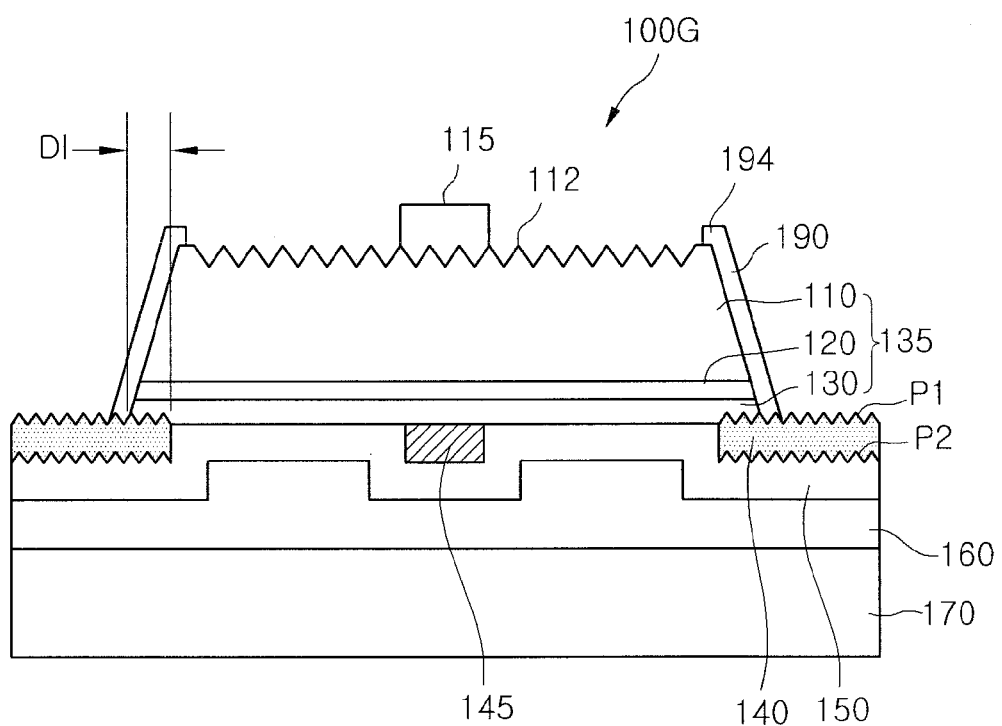
FIGS. 34 to 42 are sectional views of semiconductor light-emitting devices according to additional embodiments.

Referring to FIG. 34, in a semiconductor light-emitting device 100G, roughness patterns P1 and P2 are formed on top and bottom surfaces of a channel layer 140 to increase adhesive force according to an increase in contact area. The top roughness pattern P1 of the channel layer 140 contacts the second conductivity type semiconductor layer 130, and bottom roughness pattern P2 of the channel layer 140 contacts a top surface of the reflective layer 150. Accordingly, contact area and adhesive force between the second conductivity type semiconductor layer 130 and the reflective layer 150 may be improved. The top and bottom roughness patterns P1 and P2 of the channel layer 140 may change a critical angle of light output/input through the surface.

The roughness patterns P1 and P2 may have, for example, a prism, stripe, convexo-concave, or triangular sectional shape, which may vary within the technical scope of the inventive concept. The top roughness pattern P1 may be formed, for example, by etching a bottom surface of the second conductivity type semiconductor layer 130 in a pattern shape. The bottom roughness pattern P2 may be formed, for example, by etching a bottom surface of the channel layer 140.

Figure 35:
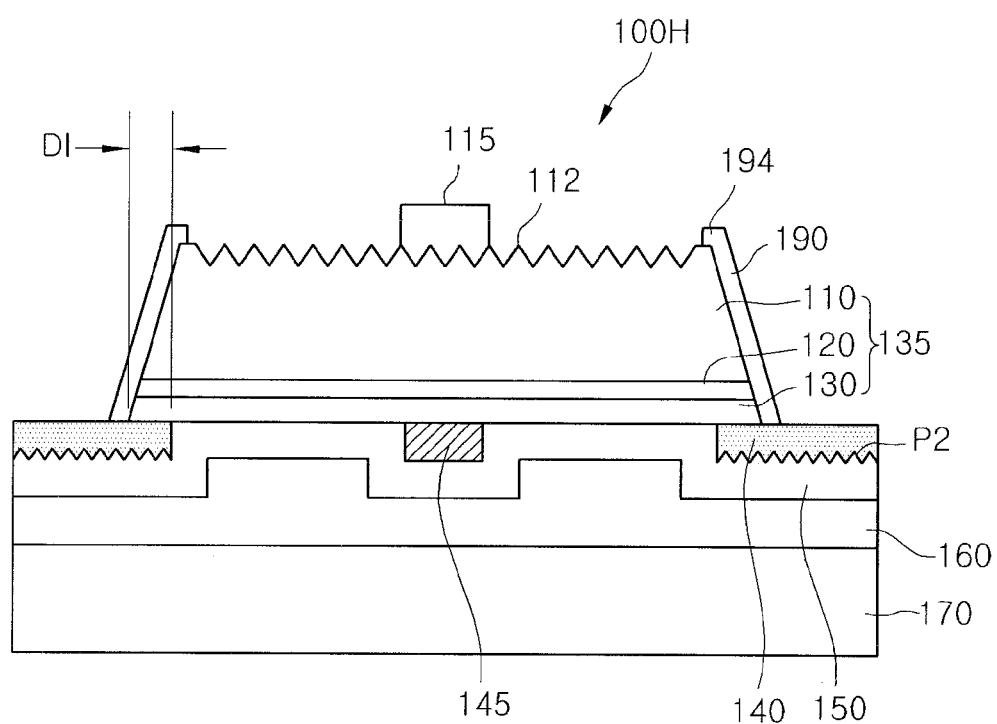

In describing the embodiment of FIG. 35, repetitive description overlapping with the embodiments of FIGS. 1 and 34 has been omitted. Referring to FIG. 35, in a semiconductor light-emitting device 100H, a roughness pattern P2 may be formed on a bottom surface of a channel layer 140 to increase the adhesive force according to an increase in contact area with the reflective layer 150. The roughness pattern P2 of the channel layer 140 may change a critical angle of light output/input through the surface.

Figure 36:
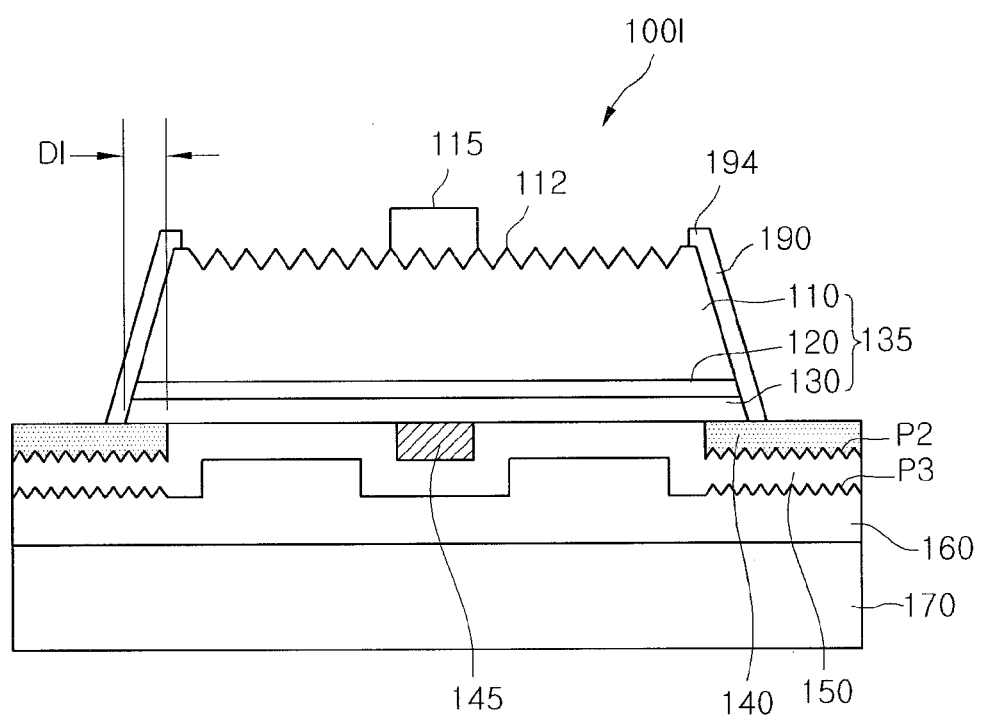

In describing the embodiment of FIG. 36, repetitive description overlapping with the embodiments of FIGS. 1 and 34 has been omitted. Referring to FIG. 36, in a semiconductor light-emitting device 100I, a roughness pattern P2 may be formed on an outer top and/or bottom surface(s) of a reflective layer 150 to increase adhesive force according to an increase in contact area with the adhesion layer 160 and the channel layer 140 adjacent to the outside the reflective layer 150. The top roughness pattern P2 of the channel layer 140 may change a critical angle of light output/input through the surface, and the bottom roughness pattern P3 may improve adhesive force with respect to the adhesion layer 160.

Figure 37:
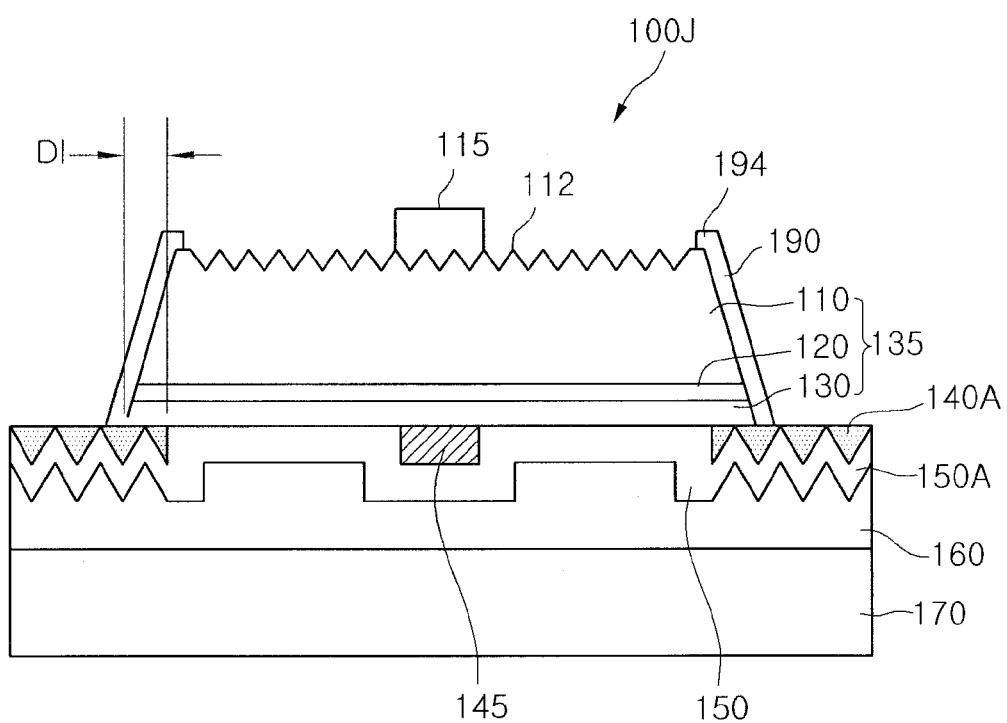

In describing the embodiment of FIG. 37, repetitive description overlapping with the embodiments of FIGS. 1 and 34 has been omitted. Referring to FIG. 37, in a semiconductor light-emitting device 100J, a bottom of a channel layer 140A may be etched to form a sawtooth-wave roughness pattern, and an outside 150A of the reflective layer 150 may be formed to have a convexo-concave roughness pattern along a bottom surface of the channel layer 140. Herein, an etching depth may be equal to about a thickness of the channel layer 140A, and the etching angle may be inclined or perpendicular.

Figure 38:
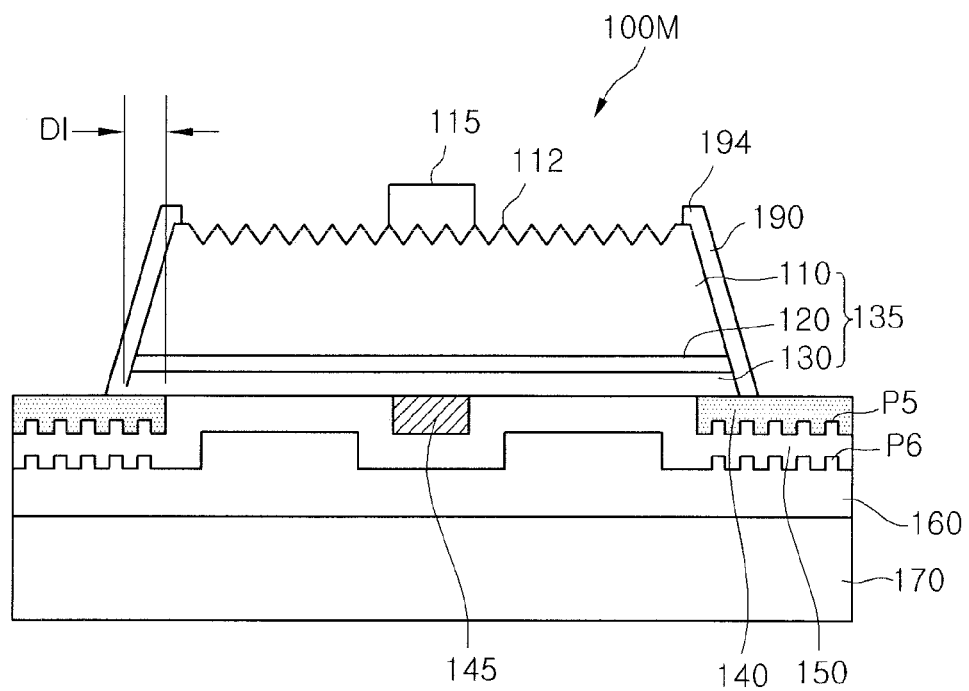

In describing the embodiment of FIG. 38, repetitive description overlapping with the embodiments of FIGS. 1 and 34 has been omitted. Referring to FIG. 38, in a semiconductor light-emitting device 100M, a bottom of a channel layer 140 may be etched to form a convexo-concave or square-wave roughness pattern P5, and an outside of the reflective layer 150 may be formed to have a convexo-concave or square-wave roughness pattern P6 along a bottom surface of the channel layer 140. Herein, an etching depth may be less than a thickness of the channel layer 140, and an etching shape may be polygonal and hemispheric.

Figure 39:
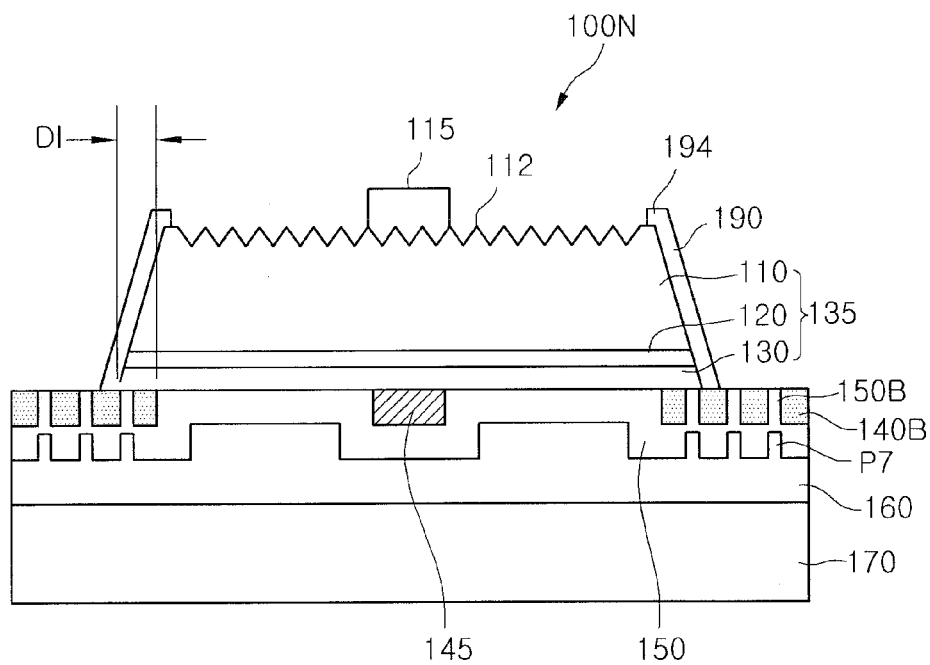

In describing the embodiment of FIG. 39, repetitive description overlapping with the embodiments of FIGS. 1 and 34 has been omitted. Referring to FIG. 39, in a semiconductor light-emitting device 100N, a bottom of a channel layer 140B may be etched to form a convexo-concave or square-wave roughness pattern P7, and an outside 150B of the reflective layer 150 may be formed to have a convexo-concave or square-wave roughness pattern along a bottom surface of the channel layer 140B. Accordingly, the channel layer 140B may be divided into a plurality of regions; however, embodiments are not limited thereto. An etching depth may be less than a thickness of the channel layer 140B, an etching shape may be polygonal and hemispheric, a concave interval and/or a convex interval may be equal to or different from each other.

Figure 40:
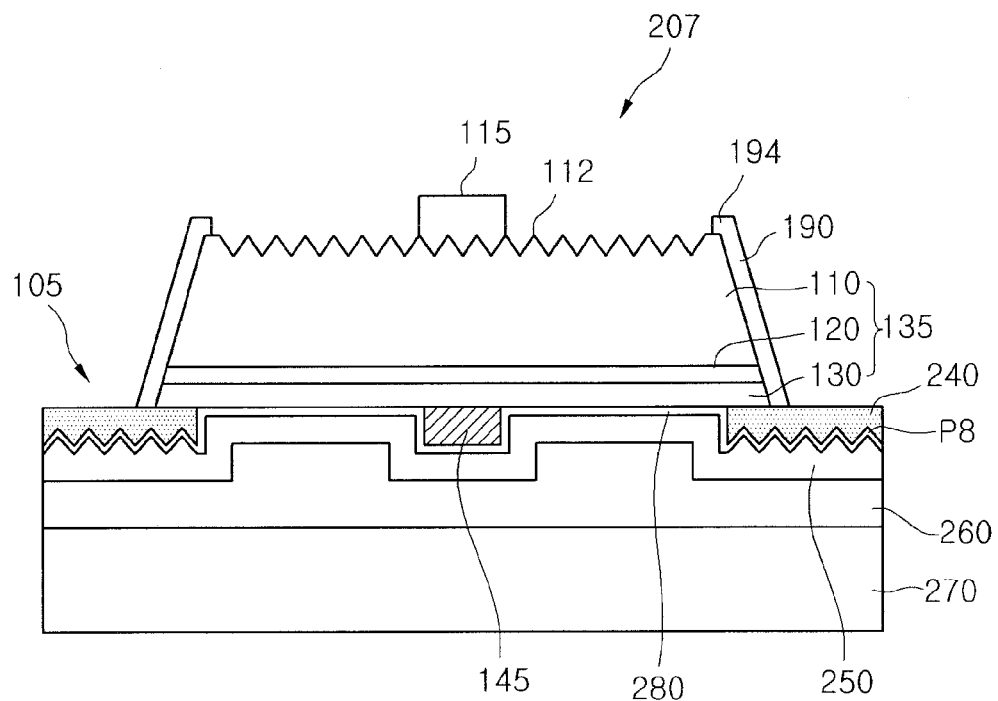

In describing the embodiment of FIG. 40, repetitive description overlapping with the embodiment of FIG. 22 has been omitted. Referring to FIG. 40, in a semiconductor light-emitting device 207, a bottom of a channel layer 240 may be etched to form a roughness pattern P8, and an outside of an ohmic layer 280 may be formed to have a roughness pattern along the roughness pattern P8. The roughness pattern P8 may increase contact area between two adjacent layers to improve adhesive force.

Figure 41:
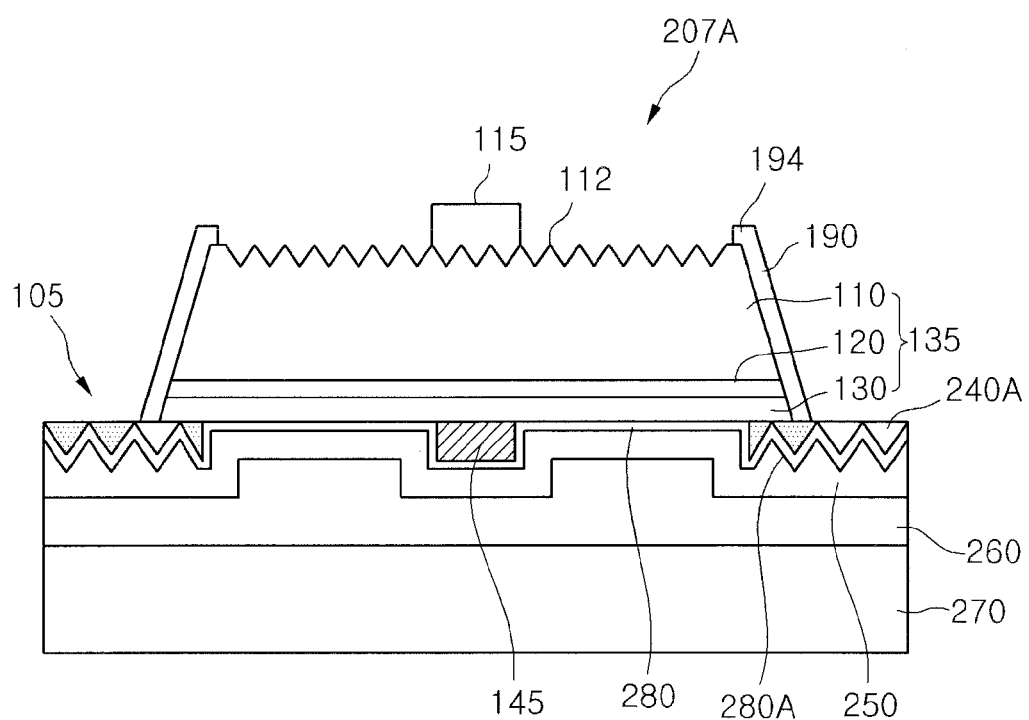

In describing the embodiment of FIG. 41, repetitive description overlapping with the embodiment of FIG. 22 has been omitted. Referring to FIG. 41, in a semiconductor light-emitting device 207A, a bottom of a channel layer 240A may be etched to form a sawtooth-wave roughness pattern, and an outside 280A of an ohmic layer 280 may be formed to have a roughness pattern along a bottom surface of the channel layer 240. An etching depth may be less than a thickness of the channel layer 140A, and an etching angle may be inclined or perpendicular.

Figure 42:
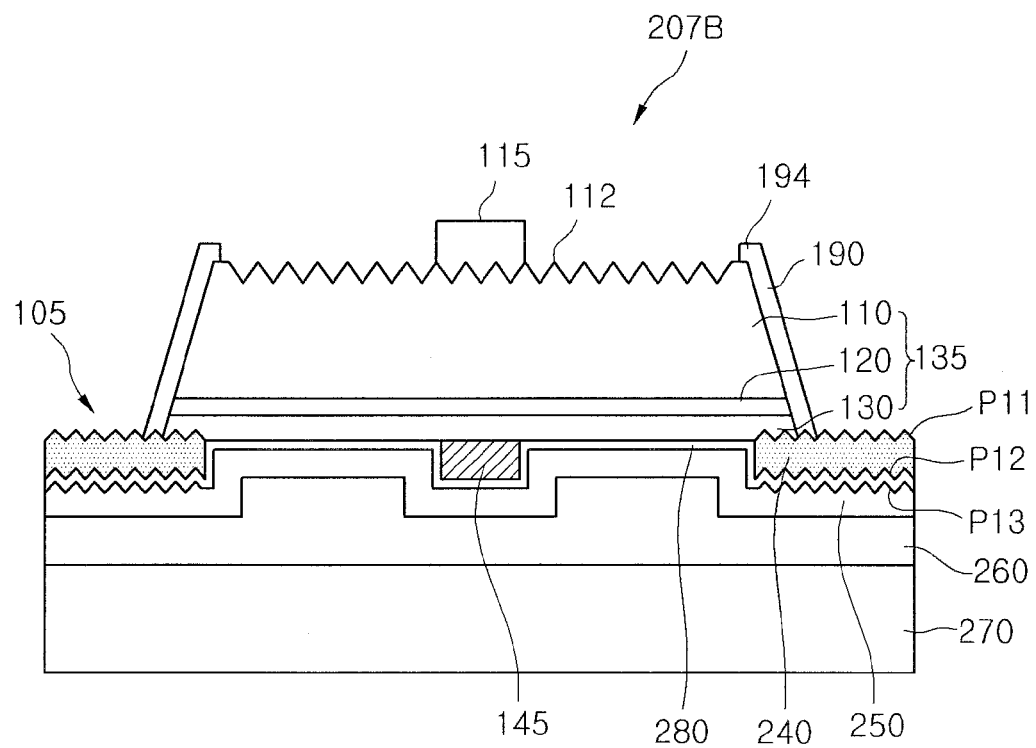

In describing the embodiment of FIG. 42, repetitive description overlapping with the embodiment of FIG. 22 has been omitted. Referring to FIG. 42, in a semiconductor light-emitting device 207B, roughness patterns P11 and P12 may be formed on top and bottom surfaces of a channel layer 240. The top roughness pattern P11 of the channel layer 140 may contact a bottom outside of the second conductivity type semiconductor layer 130, and bottom roughness pattern P12 of the channel layer 140 may contact a top surface of the ohmic layer 280. Accordingly, contact area and adhesive force between the second conductivity type semiconductor layer 130 and the ohmic layer 280 may be improved.

The roughness patterns P11 and P12 may have, for example, a prism, stripe, convexo-concave, and sawtooth-wave (for example, triangular sectional) shape, which may vary within the technical scope of the inventive concept. The top roughness pattern P11 may be formed, for example, by etching a bottom surface of the second conductivity type semiconductor layer 130 in a pattern shape. The bottom roughness pattern P12 may be formed by, for example, etching a bottom surface of the channel layer 240. An outer bottom surface of the reflective layer 250 may have a roughness pattern P13 due to the ohmic layer 280, thereby changing a critical angle of input/output light. The roughness patterns P12 and P13 of the reflective layer 250 and the channel layer 240 may be formed on some or all of the surfaces of each layer.

Figure 43:
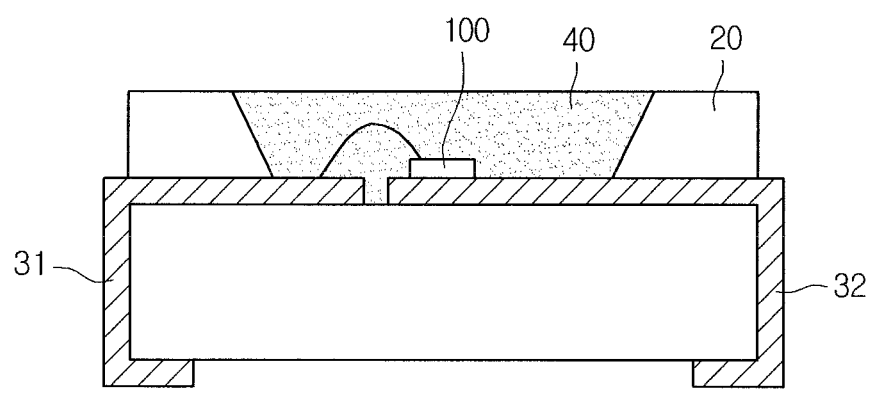
FIG. 43 is a sectional view of a light-emitting device package according to an embodiment.

FIG. 43 is sectional view of a light-emitting device package according to an embodiment. Referring to FIG. 43, a light-emitting device package according to an embodiment 28 may include a body 20, a first lead electrode 31, a second lead electrode 32, a semiconductor light-emitting device 100, and a molding member 40. The first lead electrode 31 and the second lead electrode 32 may be disposed on the body 20. The semiconductor light-emitting device 100 disposed on the body 20 may be electrically connected to the first lead electrode 31 and the second lead electrode 32. The molding member 40 may be configured to mold the semiconductor light-emitting device 100.

The body 20 may be formed to include a silicon material, a synthetic resin, or a metallic material. An inclined surface may be formed around the semiconductor light-emitting device 100.

The first lead electrode 31 and the second lead electrode 32 may be electrically disconnected from each other, and may provide power to the semiconductor light-emitting device 100. Also, the first lead electrode 31 and the second lead electrode 32 may reflect light emitted from the semiconductor light-emitting device 100, thus increasing light efficiency. Also, the first lead electrode 31 and the second lead electrode 32 may serve to discharge heat generated by the semiconductor light-emitting device 100.

The semiconductor light-emitting device 100 may be disposed on the body 20, or may be disposed on the first lead electrode 31 or the second lead electrode 32. The semiconductor light-emitting device 100 may be electrically connected by, for example, a wire to the first lead electrode 31, and may be connected to the second lead electrode 32 in a die-bonding configuration.

The molding member 40 may mold the semiconductor light-emitting device 100 to protect the semiconductor light-emitting device 100. Also, a fluorescent material may be included in the molding member 40 to change a wavelength of light emitted from the semiconductor light-emitting device 100.

Each embodiment is not limited thereto, and may be selectively applied to the other embodiments. Also, the semiconductor light-emitting device according to the embodiments disclosed herein may be packaged in a semiconductor substrate, an insulating substrate or a ceramic substrate (such as a resin material or silicon), and may be used as a light source of a indication device, an illumination device or a display device.

As described above, embodiments disclosed herein may improve the light extraction efficiency. Also, the embodiments disclosed herein may overcome the problem of adhesion between the layers disposed under the light-emitting structure.

Further, the embodiments disclosed herein may overcome the problem of the adhesion between the metal and the non-metal in the channel region under the light-emitting structure. Furthermore, the embodiments disclosed herein may overcome the problem of the interlayer exfoliation in the channel region by improving the adhesive force between the reflective material and the oxide under the light-emitting structure. Additionally, the embodiments disclosed herein may improve reliability of the semiconductor light-emitting device.

The embodiments disclosed herein are applicable to any light-emitting device that provides light.

Embodiments disclosed herein provide a semiconductor light-emitting device capable of improving adhesive force between layers disposed under a light-emitting structure including a compound semiconductor layer and a method for fabricating the same.

According to one embodiment disclosed herein, a semiconductor light-emitting device is provided that may include a light-emitting structure including a plurality of compound semiconductor layers; an electrode on the compound semiconductor layer; a reflective layer under the compound semiconductor layer; a conductive support member under the reflective layer; and a channel layer along a bottom edge of the compound semiconductor layer.

According to another embodiment disclosed herein, a method for fabricating a semiconductor light-emitting device is provided that may include forming a plurality of compound semiconductor layers on a substrate; forming a channel layer along a top edge of the compound semiconductor layer; forming a reflective layer on the compound semiconductor layer; turning the reflective layer to the base and removing the substrate; etching the compound semiconductor layer to expose the channel layer; and forming an electrode on the compound semiconductor layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light-emitting device, comprising:
a conductive support member;
a reflective layer disposed above the conductive support member;
an adhesion layer between the reflective layer and the conductive support member;
a light-emitting structure disposed above the reflective layer, the light-emitting structure comprising a first conductive type semiconductor layer, an active layer disposed on the first conductive type semiconductor layer, and a second conductive type semiconductor layer disposed on the active layer;
an electrode disposed on the light emitting structure;
a channel layer disposed along a bottom edge of the light emitting structure; and
a current blocking layer that corresponds to the electrode, wherein the adhesion layer has a top surface including a plurality of first protrusion portions and a plurality of first recess portions, wherein the reflective layer has a bottom surface including a plurality of second protrusion portions and a plurality of second recess portions, wherein one of the plurality of second protrusions of the reflective layer under the current blocking layer is disposed on at least one of the plurality of first recess portions or the plurality of first protrusion portions of the adhesion layer, and wherein the top surface of the adhesion layer contacts the bottom surface of the channel layer.

2. The semiconductor light-emitting device according to claim 1, wherein the reflective layer ohmic-contacts a bottom surface of the light emitting structure and includes a reflective metal.

3. The semiconductor light-emitting device according to claim 1, wherein an inner end of the channel layer contacts an outer end of the reflective layer.

4. The semiconductor light-emitting device according to claim 1, wherein the reflective layer extends to partially underlie a bottom surface of the channel layer.

5. The semiconductor light-emitting device according to claim 4, wherein the reflective layer is formed under a portion of the bottom surface of the channel layer to a width less than about 80% of a width of the channel layer.

6. The semiconductor light-emitting device according to claim 1, wherein the current blocking layer is formed on one of the reflective layer and the conductive support member.

7. The semiconductor light-emitting device according to claim 1, wherein the current blocking layer is formed of at least one selected from the group consisting of ITO, IZO, IZTO, IAZO, IGZO, IGTO, AZO, ATO, ZnO, $SiO_2$, $SiO_x$, $SiO_xNy$, $Si_3N4$, $Al_2O_3$, and $TiO_2$.

8. The semiconductor light-emitting device according to claim 1, wherein the channel layer includes at least one of transparent nitride, transparent oxide, or a transparent insulating material.

9. The semiconductor light-emitting device according to claim 1, wherein the channel layer is formed of at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xNy$, $Si_3N4$, $Al_2O_3$, and $TiO_2$.

10. The semiconductor light-emitting device according to claim 1, further comprising an insulating layer disposed along an outer edge of the light-emitting structure.

11. The semiconductor light-emitting device according to claim 1, further comprising a roughness pattern formed on the light-emitting structure.

12. The semiconductor light-emitting device according to claim 1, wherein the light-emitting structure includes at least one of a P-N junction, a N-P junction, a P-N-P junction, and a N-P-N junction using a Group III-V compound semiconductor.

13. The semiconductor light-emitting device according to claim 1, wherein the plurality of first protrusion portions of the adhesion layer contact the plurality of second recess portions of the reflective layer, respectively.

14. The semiconductor light-emitting device according to claim 1, wherein the plurality of first recess portions of the adhesion layer contact the plurality of second protrusion portions of the reflective layer, respectively.

15. The semiconductor light-emitting device according to claim 1, wherein at least one of the plurality of second protrusion portions corresponds to the current blocking layer.

16. The semiconductor light-emitting device according to claim 1, wherein the plurality of second recess portions of the reflective layer are positioned between the current blocking layer and the channel layer.

17. The semiconductor light-emitting device according to claim 1, wherein the plurality of first protrusion portions and the plurality of first recess portions of the adhesion layer have different height with respect to a bottom surface of the adhesion layer.

18. The semiconductor light-emitting device according to claim 1, wherein the current blocking layer is vertically aligned with the electrode.

* * * * *